(12) United States Patent
Yasuoka et al.

(10) Patent No.: US 6,943,422 B2
(45) Date of Patent: Sep. 13, 2005

(54) SEMICONDUCTOR PHOTODETECTING DEVICE AND METHOD FOR FABRICATING THE SAME

(75) Inventors: Nami Yasuoka, Kawasaki (JP); Haruhiko Kuwatsuka, Kawasaki (JP); Akito Kuramata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/624,553

(22) Filed: Jul. 23, 2003

(65) Prior Publication Data

US 2004/0145025 A1 Jul. 29, 2004

(30) Foreign Application Priority Data

Jul. 23, 2002 (JP) ........................................ 2002-214408

(51) Int. Cl.[7] .................. H01L 31/0232; H01L 21/00
(52) U.S. Cl. .................. 257/432; 250/208.1; 250/208.2
(58) Field of Search ........................ 257/432; 250/208.1, 250/208.2

(56) References Cited

U.S. PATENT DOCUMENTS

| | | | | |
|---|---|---|---|---|
| 5,572,014 A | * | 11/1996 | Wu et al. | 250/208.2 |
| 5,631,768 A | * | 5/1997 | Bruno | 359/333 |
| 5,701,379 A | * | 12/1997 | Takeuchi | 385/131 |
| 6,353,250 B1 | * | 3/2002 | Fukano | 257/432 |
| 6,498,873 B1 | * | 12/2002 | Chandrasekhar et al. | 385/28 |
| 6,528,776 B1 | * | 3/2003 | Marsland | 250/208.2 |
| 6,710,378 B1 | * | 3/2004 | Makiuchi et al. | 257/184 |
| 2002/0003202 A1 | * | 1/2002 | Yasuoka | 250/214.1 |
| 2003/0098408 A1 | * | 5/2003 | Yasuoka et al. | 250/214.1 |

FOREIGN PATENT DOCUMENTS

| | | | |
|---|---|---|---|
| EP | 777139 | * | 6/1997 |
| JP | 2-72679 | * | 3/1990 |
| JP | 9-139520 | * | 5/1997 |
| JP | 9-153638 | * | 6/1997 |
| JP | 2002-26370 | | 1/2002 |

OTHER PUBLICATIONS

N. Yasuoka et al., "A polarization–independent high–speed PIN photodiode integrated with a spot size converter"; CPT2001 Technical Digest; 2001; pp 105–106.

\* cited by examiner

*Primary Examiner*—Nathan J. Flynn
*Assistant Examiner*—Ahmed N. Sefer
(74) *Attorney, Agent, or Firm*—Armstrong, Kratz, Quintos, Hanson & Brooks, LLP

(57) ABSTRACT

A semiconductor photodetecting device including a PIN photodiode formed on an SI-InP substrate; a buried optical waveguide portion formed on the SI-InP substrate and including the film thickness continuously increased toward the PIN photodiode and an InP clad layer covering the upper surface and the side surface of the InGaAsP core layer; and a ridge-shaped connection optical waveguide portion formed on the SI-InP substrate between the PIN photodiode and the buried optical waveguide portion and including the InGaAsP core layer and the InP clad layer selectively covering only the upper surface of the InGaAsP core layer.

15 Claims, 19 Drawing Sheets

SEMICONDUCTOR PHOTODETECTING DEVICE AND METHOD FOR FABRICATING THE SAME

CROSS-REFERENCE TO RELATED APPLICATION

This application is based upon and claims priority of Japanese Patent Application No. 2002-214408, filed on Jul. 23, 2002, the contents being incorporated herein by reference.

BACKGROUND OF THE INVENTION

1. Field of the Invention

The present invention relates to a semiconductor photodetecting device and a method for fabricating the semiconductor photodetecting device, more specifically a semiconductor photodetecting device having an optical waveguide for leading light to a photodetector formed integral therewith and a method for fabricating the semiconductor photodetecting device.

2. Description of the Related Art

With the recent development of information communication networks represented by internets, faster optical communication systems are increasingly required. This also requires semiconductor photodetecting devices used in the detection of optical signals, etc. in the optical communication systems to be operative fast at information transfer speeds of above 40 Gbit/s.

As a semiconductor photodetecting device which is operative fast, the semiconductor photodetecting device invented by the inventors of the present application, which comprises a tapered optical waveguide which can be easily connected to optical fibers, and a photodiode, which are integral with each other is known (see, e.g., Japanese Patent Laid-Open Publication No. 2002-26370).

FIGS. 19A–19D are diagrammatic views of the structure of the prior art semiconductor photodetecting device integrally including the tapered optical waveguide. FIG. 19A is a sectional view of the prior art semiconductor photodetecting device in the direction of light propagation. FIG. 19B is the sectional view along the line A–A' in FIG. 19A. FIG. 19C is the sectional view along the line B–B' in FIG. 19A. FIG. 19D is the sectional view along the line C–C' in FIG. 19A.

An optical waveguide unit 102 for incident light to propagate through, and a photodetection unit 104 for detecting the light which has propagated through the optical waveguide unit 102 are disposed adjacent to each other on an SI(Semi-Insulating)-InP substrate 100.

An n type InP layer 106 is formed on the SI-InP substrate 100.

A tapered InGaAsP core layer 108 having the thickness continuously increased from the end of the SI-InP substrate 100 toward the photodetection unit 104 is formed on the n type InP layer 106 of the optical waveguide unit 102. An InP clad layer 110 is formed on the n type InP layer 106 with the InGaAsP core layer 108 buried in.

A non-doped InGaAs photoabsorption layer 112 is formed on the n type InP layer 106 of the photodetection unit 104. A p type semiconductor layer 114 is formed on the InGaAs photoabsorption layer 112. Thus, a PIN photodiode 116 having the InGaAs photoabsorption layer 112 sandwiched by the n type semiconductor layer 114 and the n type InP layer 106 is formed.

The end surface of the PIN photodiode 116 on the side of the optical waveguide 102 is optically coupled to the end surface of the InGaAsP core layer 108 on the side of the photodetection unit 104.

A p type electrode 118 is formed on the p type semiconductor layer 114 of the PIN photodiode 116. An n type electrode 120 is formed on the n type InP layer 106 of the photodetection unit 104.

Light which has be led to the semiconductor photodetecting device by an external optical waveguide, such as an optical fiber or others, is incident on one end of the InGaAsP core layer 108 at the end of the buried optical waveguide unit 102.

The light incident on the InGaAsP core layer 108 propagates through the InGaAsP core layer 108 toward the photodetection unit 104 to be incident on the side surface of the InGaAs photoabsorption layer 112 of the PIN photodiode 116.

The PIN photodiode 116 on which the light which has propagated through the InGaAsP core layer 108 is incident outputs electric signals corresponding to intensities of the incident light to the p type electrode 118, based on the principle of photoelectric conversion.

The prior art semiconductor photodetecting device shown in FIGS. 19A–19D can have response characteristics of 40 GHz, and the inventors of the present application, et al. have fabricated test semiconductor photodetecting devices having no dependence on polarized wave, and having higher photodetecting efficiencies (see, e.g., CPT2001 Technical Digest (2001) p.105).

For the above-described prior art semiconductor photodetecting device having the tapered optical waveguide to realized high speed operation, the capacitance of the photodetection unit must be small. For the low capacitance of the element, it will be most effective to form the element in mesa. The PIN photodiode is formed in mesa, whereby the PIN junction capacitance can be halved in comparison with that of the prior art structure.

However, it has been difficult in the fabrication to monolithically integrate the mesa-shaped photodetection element and the tapered optical waveguide. This is because it is difficult that the mesa-shaped photodetection element and the tapered optical waveguide are concurrently patterned and etched, and accordingly the optical coupling loss between the tapered optical waveguide and the mesa-shaped photodetection element becomes large.

SUMMARY OF THE INVENTION

An object of the present invention is to provide a semiconductor photodetecting device which has high photodetecting efficiency, is operative at high speed and can be fabricated with high yields, and a method for fabricating the semiconductor photodetecting device.

According to one aspect of the present invention, there is provided a semiconductor photodetecting device comprising: a photodetector formed on a semiconductor substrate; and a tapered optical waveguide formed on the semiconductor substrate and including a tapered core layer which has a film thickness continuously increased toward the photodetector, and an upper clad layer which covers the upper surface and the side surface of the core layer and has a film thickness continuously decreased toward the photodetector.

According to another aspect of the present invention, there is provided a semiconductor photodetecting device comprising: a photodetector formed on a semiconductor substrate; a tapered optical waveguide formed on the semiconductor substrate and including a tapered core layer which has a film thickness continuously increased toward the photodetector, and an upper clad layer which covers the upper and the side surface of the core layer; and a ridge-shaped optical waveguide formed on the semiconductor substrate between the photodetector and the tapered optical waveguide and including a core layer and an upper clad layer selectively covering only the upper surface of the core layer.

According to further another aspect of the present invention, there is provided a semiconductor photodetecting device comprising: a photodetector formed on a semiconductor substrate; a tapered optical waveguide formed on the semiconductor substrate and including a tapered core layer which has a film thickness continuously increased toward the photodetector and an upper clad layer which covers the upper surface and the side surface of the core layer and has a film thickness continuously decreased toward the photodetector; and a ridge-shaped optical waveguide formed on the semiconductor substrate between the photodetector and the tapered optical waveguide, and including a core layer and an upper clad layer selectively covering only the upper surface of the core layer.

According to further another aspect of the present invention, there is provided a method for fabricating a semiconductor photodetecting device comprising the steps of: forming a photodetector on a semiconductor substrate; forming on the semiconductor substrate a tapered core layer whose film thickness is continuously increased toward the photodetector; and forming an upper clad layer which covers the upper surface and the side surface of the core layer and has a film thickness continuously decreased toward the photodetector.

According to further another aspect of the present invention, there is provided a method for fabricating a semiconductor photodetecting device comprising the steps of: forming a photodetector on a semiconductor substrate in a first region; forming on the semiconductor substrate a tapered core layer whose film thickness is continuously increased toward the photodetector; forming a first upper clad layer on the core layer; patterning the first upper clad layer and the core layer in a striped shape having one end connected to the photodetector; and forming a first mask film for covering the first region and a second region adjacent to the first region; etching the first upper clad layer with the first mask film as a mask to form a ridge-shaped optical waveguide including the core layer and the first upper clad layer in the second region; and forming a second upper clad layer with the first mask film as a mask on the semiconductor substrate and the core layer to form a tapered optical waveguide including the core layer and the second upper clad layer in a third region adjacent to the second region.

As described above, the semiconductor photodetecting device according to the present invention comprises the photodetector formed on a semiconductor substrate, and the tapered optical waveguide formed on the semiconductor substrate and including a tapered core layer whose film thickness continuously increased toward the photodetector, and an upper clad layer whose film thickness continuously decreased toward the photodetector, whereby the tapered core layer and the photodetector can be monolithically integrated without incurring optical coupling loss increase between the tapered core layer and the photodetector. Thus, the semiconductor photodetecting device having high photodetecting efficiency and is operative at high speed can be realized.

The semiconductor photodetecting device according to the present invention comprises a photodetector formed on a semiconductor substrate, a tapered optical waveguide including a tapered core layer whose film thickness continuously increased toward the photodetector and an upper clad layer covering the upper surface and the side surface of the core layer, and a ridge-shaped optical waveguide formed on the semiconductor substrate between the photodetector and the tapered optical waveguide, and having a core layer and an upper clad layer selectively covering only the upper surface of the core layer, whereby the abnormal growth of the upper clad layer of the tapered optical waveguide near the ridge-shaped optical waveguide can be suppressed. Thus, the unsatisfactory patterning, etc. in the peripheral region of the photodetector can be suppressed. The semiconductor photodetecting device which is operative at high speed can be fabricated with high yields.

DETAILED DESCRIPTION OF THE PREFERRED EMBODIMENTS

[A First Embodiment]

Figure 1:
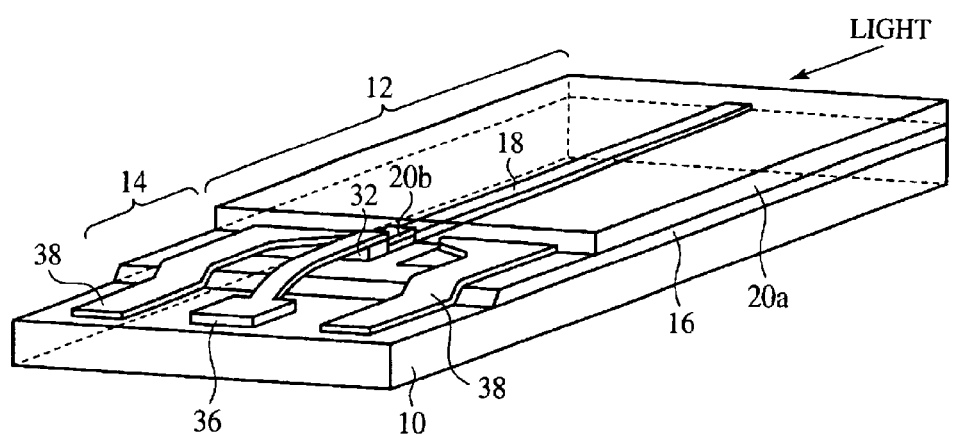
FIG. 1 is a perspective view of the semiconductor photodetecting device according to a first embodiment of the present invention, which shows a structure thereof.

The semiconductor photodetecting device according to a first embodiment of the present invention and the method for fabricating the semiconductor photodetecting device will be explained with reference to FIGS. 1, 2A–2D, 3A–3F, 4A–4F, and 5A–5C. FIG. 1 is a perspective view of the semiconductor photodetecting device according to the present embodiment, which shows a structure thereof. FIGS. 2A–2D are sectional views of the semiconductor photodetecting device according to the present embodiment, which show the structure thereof. FIGS. 3A–3F and 4A–4F are sectional views of the semiconductor photodetecting device according to the present embodiment in the steps of the method for fabricating the semiconductor photodetecting device, which show the method. FIGS. 5A–5C are upper side views of a mask used in the method for fabricating the semiconductor photodetecting device according to the present embodiment.

Figure 2A:
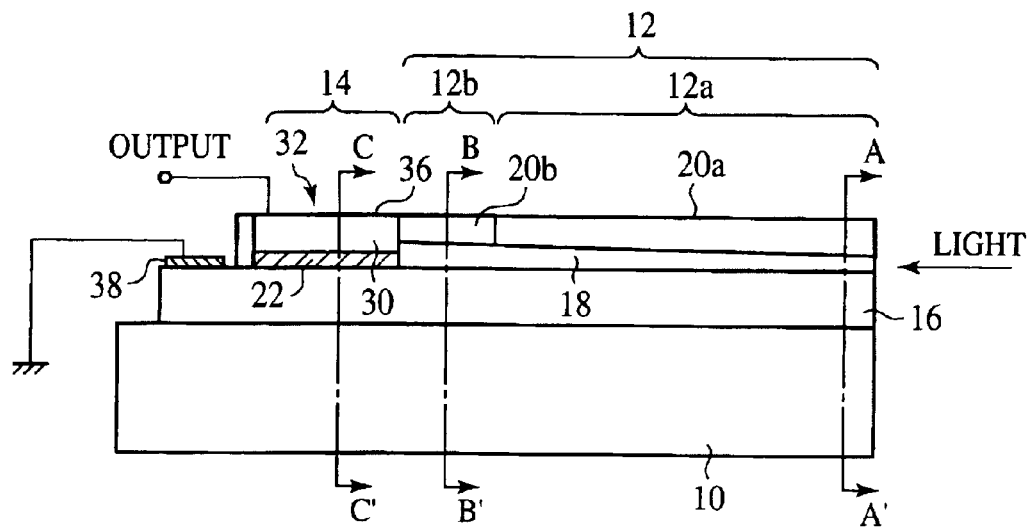
FIGS. 2A–2D are sectional views of the semiconductor photodetecting device according to the first embodiment of the present invention, which show the structure thereof.
Figure 2B:
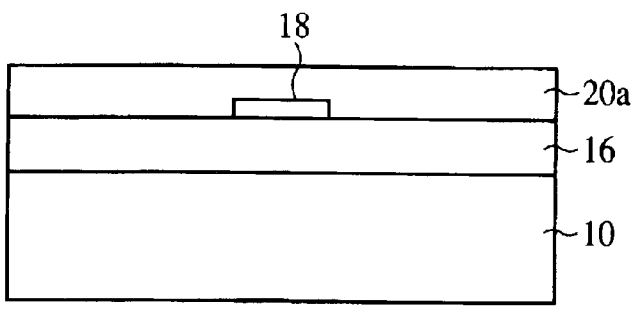
Figure 2C:
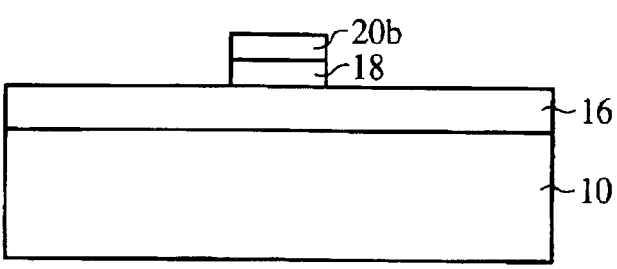
Figure 2D:
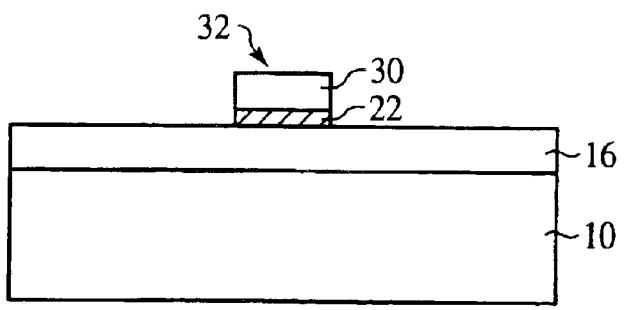

First, the semiconductor photodetecting device according to the present embodiment will be explained with reference to FIGS. 1 and 2A–2D. FIG. 2A is a sectional view of the semiconductor photodetecting device according to the present embodiment in the direction of the propagation of light. FIG. 2B is the sectional view along the line A–A' in FIG. 2A. FIG. 2C is the sectional view along the line B–B' in FIG. 2A. FIG. 2D is the sectional view along the line C–C' in FIG. 2A.

In the semiconductor photodetecting device according to the present embodiment, an optical waveguide 12 for light to propagate through and a photodetection unit 12 which detects light which has propagated through optical waveguide 12 are formed adjacent to each other on an SI-InP substrate 10.

An n type InP layer 16 which functions as a lower clad layer of the optical waveguide 12 and as an n type semiconductor layer of a PIN photodiode of the photodetection unit 14 is formed on an SI-InP substrate 10.

A tapered InGaAsP core layer 18 having the thickness continuously increased from the end of the SI-InP substrate 10 toward the photodetection unit 14 is formed on the n type InP layer 16 of the optical waveguide unit 12. An InP clad layer 20a is formed on the n type InP layer 16 in the region of the optical waveguide unit 12 other than a region nearer to the photodetection unit 14. The InGaAsP core layer 18 is thus buried with the upper surface and the side surfaces covered with the InP clad layer 20a. On the side of the optical waveguide unit 12 nearer to the photodetection unit 14 there is formed an InP clad layer 20b selectively only on the upper surface of the InGaAsP core layer 18 with the side surface of the InGaAsP layer 18 exposed.

As described above, the optical waveguide unit 12 comprises a buried optical waveguide portion 12a having the InGaAsP core layer 18 formed on the n type InP layer 16 functioning as a lower clad layer buried in the InP clad layer 20a, and a ridge-shaped connection optical waveguide portion 12b having the InP clad layer 20b formed on the upper surface of the InGaAsP core layer 18 with the side surfaces of the InGaAsP core layer 18 exposed.

A non-doped InGaAs photoabsorption layer 22 is formed on the n type InP layer 16 of the photodetection unit 14. A p type semiconductor layer 30 formed of a p type InP layer, p type InGaAsP layer and a p type InP layer which are sequentially laid one on another is formed on the InGaAs photoabsorption layer 22. A mesa-shaped PIN photodiode 32 of the n type InP layer 16, the non-doped InGaAs photoabsorption layer 22 and the p type semiconductor layer 30 sequentially laid one on another is thus formed on the SI-InP substrate 10.

The side surface of the PIN photodiode 32 on the side of the optical waveguide unit 12 is optically coupled, by butt coupling, with the end surface of the InGaAsP core layer 18 on the side of the photodetection unit 14.

A p type electrode 36 is formed on the p type semiconductor layer 30 of the PIN photodiode 32. An n type electrode 38 is formed on the n type InP layer 16 of the photodetection unit 14.

The semiconductor photodetecting device according to the present embodiment is thus constituted.

The semiconductor photodetecting device according to the present embodiment is characterized mainly in that the part of the optical waveguide unit 12 nearer to the photodetection unit 14 is the ridge-shaped connection optical waveguide portion 12b, i.e., in that the optical waveguide is ridge-shaped near the optical coupling portion of the PIN photodiode 32, which is the mesa-shaped photodetection element. As will be described later, this structure permits the tapered InGaAsP core layer 18 and the PIN photodiode 32 to be monolithically integrated without incurring optical coupling loss between the InGaAsP core layer 18 and the PIN photodiode 32, which makes it possible to realize the semiconductor photodetecting device which has high photodetecting efficiency and is operative at high speed.

Next, the operation of the semiconductor photodetecting device according to the present embodiment will be explained with reference to FIGS. 1 and 2A–2D.

Light led to the semiconductor photodetecting device by an external optical waveguide, such as an optical fiber or others is incident on one end of the InGaAsP core layer 18 at the end of the buried optical waveguide portion 12a.

The light incident on the InGaAsP core layer 18 propagates through the InGaAsP core layer 18 of the buried optical waveguide portion 12a to be thereby mode-converted.

The light propagating through the InGaAsP core layer 18 of the buried optical waveguide portion 12a next propagate through the InGaAsP core layer 18 of the ridge-shaped connection optical waveguide portion 12b. Then, the light is incident on the side surface of the InGaAs photoabsorption layer 22 of the mesa-shaped PIN photodiode 32.

The PIN photodiode 32 on which the light is incident through the InGaAsP core layer 18 of the ridge-shaped connection optical waveguide portion 12b outputs, based on the principle of the photoelectric conversion, electric signals corresponding to intensities of the incident light to the p type electrode 36.

Then, the method for fabricating the semiconductor photodetecting device according to the present embodiment will be explained with reference to FIGS. 3A–3F, 4A–4F, and 5A–5C. FIGS. 3A–3F are sectional views of the semiconductor photodetecting device shown in FIG. 2A in the direction of the propagation of light. Figures on the left side of FIGS. 4A, 4B, 4C, 4D, 4E, and 4F are sectional views respectively along the line A–A' in FIGS. 3A, 3B, 3C, 3D, 3E, and 3F. Figures in the middle of FIGS. 4A, 4B, 4C, 4D, 4E, and 4F are sectional views along the line B–B' respectively in FIGS. 3A, 3B, 3C, 3D, 3E, and 3F. Figures on the right side of FIGS. 4A, 4B, 4C, 4D, 4E, and 4F are sectional views respectively along the line C–C' in FIGS. 3A, 3B, 3C, 3D, 3E, and 3F. FIGS. 5A–5C are upper side views of a mask used in the method for fabricating the semiconductor photodetecting device according to the present embodiment.

Figure 3A:
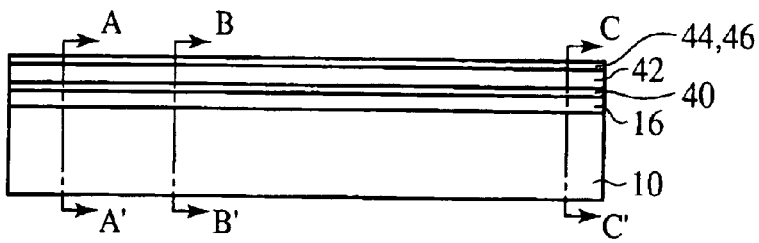
FIGS. 3A–3F are sectional views of the semiconductor photodetecting device according to the first embodiment of the present invention in the steps of the method for fabricating the same, which show the method (Part 1).
Figure 3B:
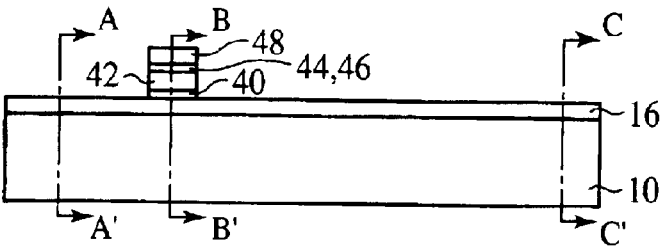
Figure 4A:
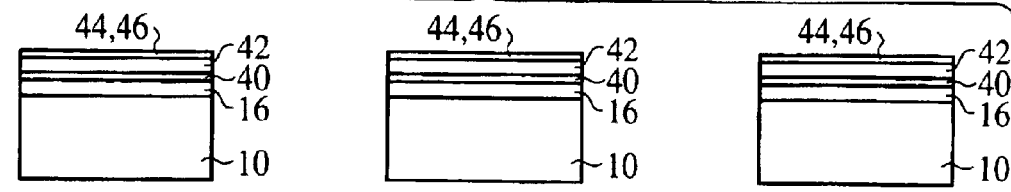
FIGS. 4A–4F are sectional views of the semiconductor photodetecting device according to the first embodiment of the present invention in the steps of the method for fabricating the same, which show the method (Part 2).
Figure 4B:
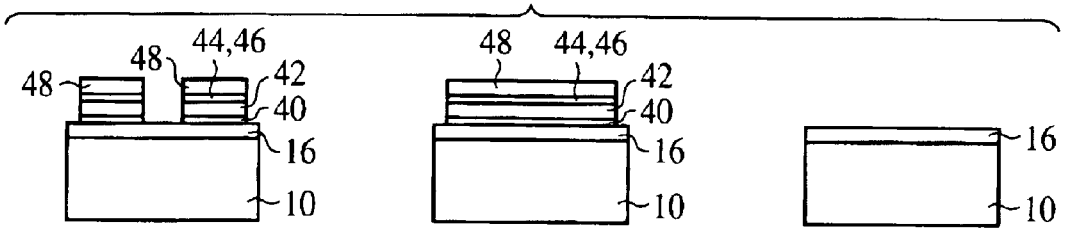
Figure 5A:
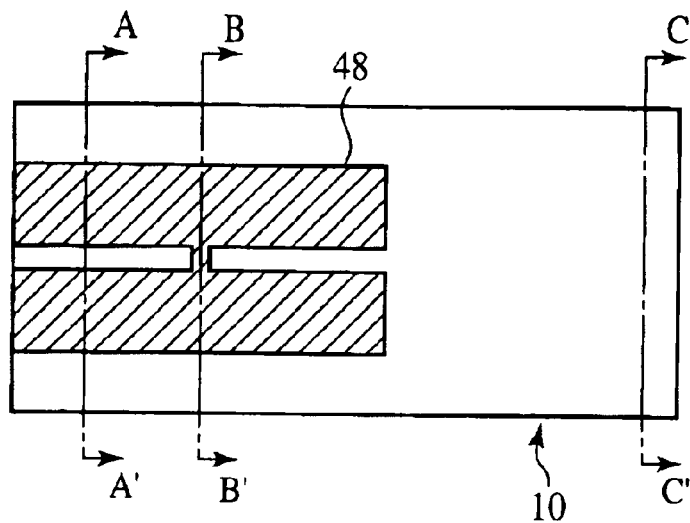
FIGS. 5A–5C are upper side views of a mask used in the semiconductor photodetecting device according to the first embodiment of the present invention.
Figure 5B:
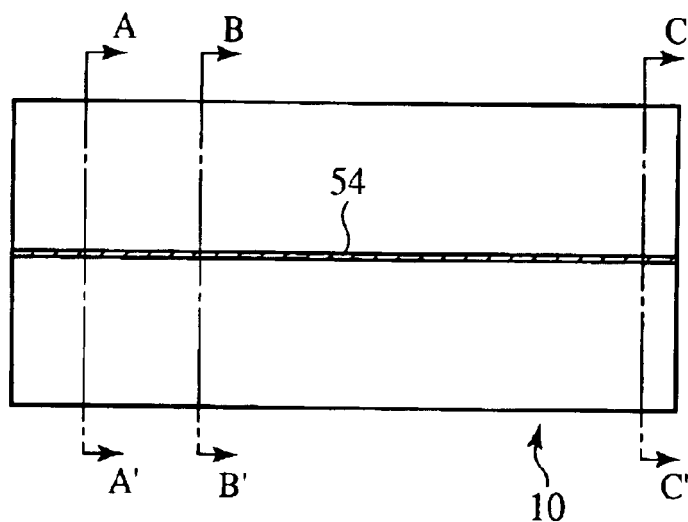
Figure 5C:
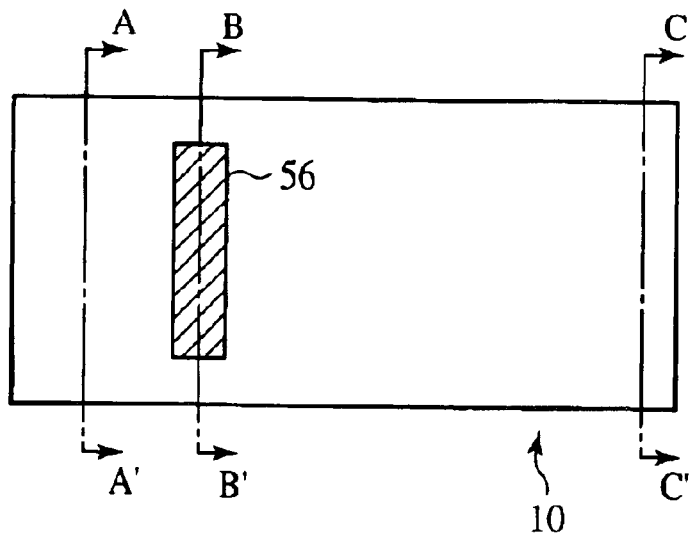

First, a 2 $\mu$m-thickness n type InP layer 16, a 0.2 $\mu$m-thickness InGaAs layer 40, a 1.5 $\mu$m-thickness p type InP layer 42, 0.3 $\mu$m-thickness p type InGaAs layer 44 and a 0.05 $\mu$m-thickness p type InP layer 46 are sequentially grown epitaxially by, e.g., metal organic vapor phase epitaxy (MOVPE) on the SI-InP substrate 10 (see FIGS. 3A and 4A). The p type InP layer 46 grown here is to be etched off when the p type electrode 38 is formed.

Then, a silicon oxide film is formed by, e.g., CVD on the thus-formed epi-wafer. Subsequently, as shown in FIG. 5A, a silicon oxide film 48 is formed by lithography and etching in a region for the PIN photodiode 32 to be formed in and ridge-shaped regions sandwiching the PIN photodiode 32-to-be-formed region.

Next, the p type InP layer 46, the n type InGaAs layer 44, the p type InP layer 42 and the InGaAs layer 40 are patterned by, e.g., reaction ion etching (RIE) with the silicon oxide film 48 as a mask. Thus, the n type InP layer 16 is exposed in the region where the silicon oxide film 48 is not formed. On the other hand, in the PIN photodiode 32-to-be-formed region and the ridge-shaped regions sandwiching the PIN photodiode 32-to-be-formed region where the silicon oxide film 48 is formed, the p type InP layer 46, the p type InGaAs layer 44, the p type InP layer 42 and the InGaAs layer 40 ramain (see FIGS. 3B and 4B).

Figure 3C:
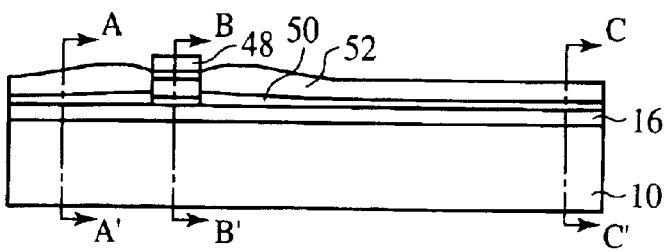
Figure 3D:
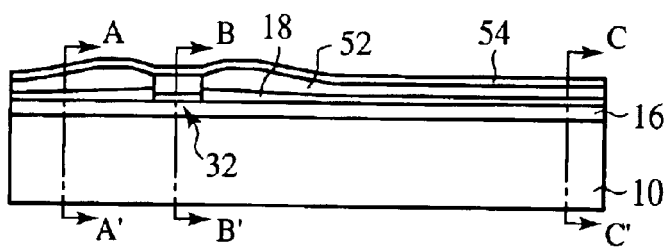
Figure 3E:
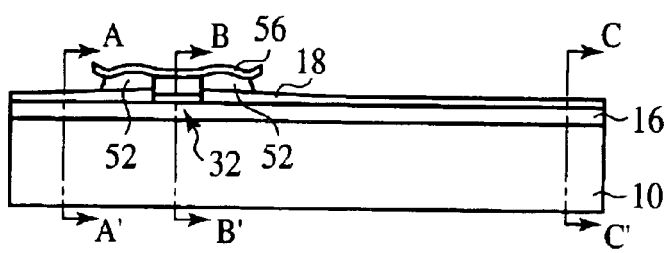
Figure 3F:
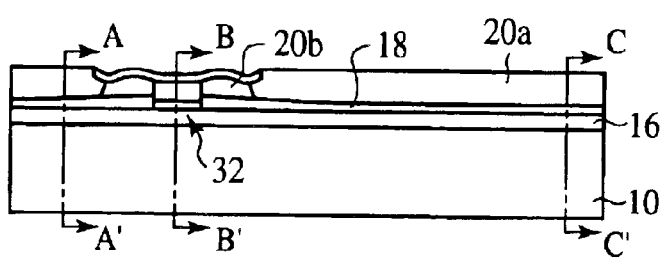
Figure 4C:
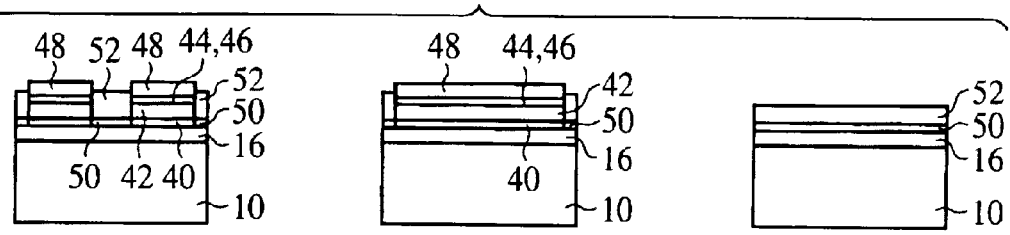
Figure 4D:
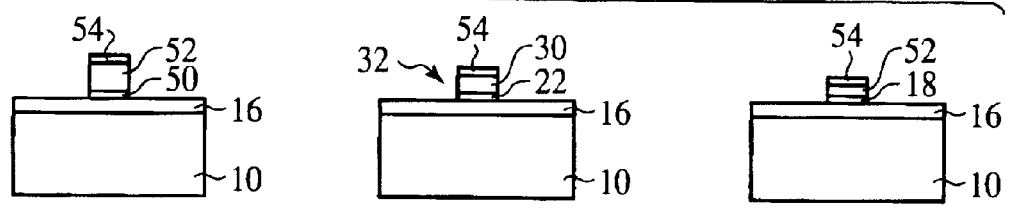
Figure 4E:
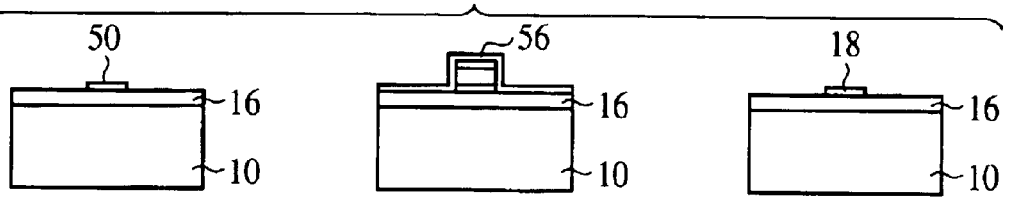
Figure 4F:
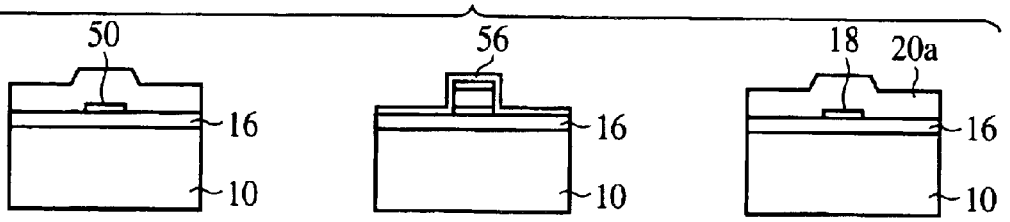

Then, an InGaAsP layer 50 and an InP layer 5 are sequentially formed on the entire surface with the silicon oxide film 48 as a selective growth mask by, e.g., MOVPE (see FIGS. 3C and 4C). The InGaAsP layer 50 is grown, for example, at 150 Torr and 650° C. by using arsine, phosphine, trimethylindium and trimethylgallium as raw materials. The InP layer 52 is grown at 10 Tprr and 650° C. by using phosphine and trimethyl indium as raw materials.

In forming the InGaAsP layer 50, the raw material atoms deposited on the silicon oxide film 48 move along the surface of the silicon oxide film 48. Then, the raw atoms arrives at the trench between the ridge-shaped regions sandwiching the region for the PIN photodiode 32 to be formed in to deposit on the n type InP layer 16 exposed on the bottom of the trench. Consequently, the InGaAsP layer 50 is formed in a tapered shape whose thickness is continuously increased toward the PIN photodiode 32 (see FIG. 3C).

After the InGaAsP layer 50 and the InP layer 52 have been formed, the silicon oxide film 48 which has been used as the selective growth mask is removed.

Then, a silicon oxide film is formed on the entire surface by, e.g., CVD. Subsequently, as shown in FIG. 5B, a stripe-shaped silicon oxide film 54 is formed, covering the InGaAsP core layer 18 and the region for the PIN photodiode 32 to be formed in.

Then, the InP layer 52, the InGaAsP layer 50, the p type InP layer 46, p type InGaAs layer 44, the p type InP layer 42 and the InGaAs layer 40 are patterned with the silicon oxide film 54 as a mask by, e.g., RIE. Thus, in the optical waveguide unit 12, the InGaAsP layer 50 is striped, and the InGaAsP core layer 18 is formed. Concurrently therewith, in the photodetection unit 14, the p type InP layer 46, the p type InGaAs layer 44, the p type InP layer 42 and the InGaAs layer 40 are striped, and the mesa-shaped PIN photodiode 32 is formed (see FIGS. 3D and 4D).

As described above, according to the present embodiment, the InGaAsP core layer 18 of the buried optical waveguide portion 12a and the ridge-shaped connection optical waveguide portion 12b, and the PIN photodiode 32 can be concurrently patterned and etched. The tapered InGaAsP core layer 18 and the PIN photodiode 32 are thus monolithically integrated without increasing the optical coupling loss between the InGaAsP core layer 18 and the PIN photodiode 32. Thus, the semiconductor photodetecting device which has high photodetecting efficiency and is operative at high speed can be realized.

The silicon oxide film 54 is removed after the InGaAsP core layer 18 and the PIN photodiode 32 have been formed.

Then, a silicon oxide film is formed on the entire surface by, e.g., CVD. Subsequently, as shown in FIG. 5C, the silicon oxide film 56 is formed by lithography and etching in the shape covering the ridge-shaped region sandwiching both sides of the PIN photodiode 32.

Then, the InP layer 52 is etched by, e.g., RIE with the silicon oxide film 56 as a mask. The InP layer 52 is left in the ridge-shaped regions on both sides of the PIN photodiode 32 (see FIGS. 3E and 4E). In the ridge-shaped connection optical waveguide portion 12b, the InP clad layer 20b is selectively formed on the upper surface of the InGaAsP core layer 18.

Then, with the silicon oxide film 56 as a selective growth mask, an InP layer is formed on the entire surface by, e.g., MOVPE. Thus, the InGaASP core layer 18 is buried in the InP clad layer 20a in the buried optical waveguide portion 12a (see FIGS. 3F and 4F).

Subsequently, by the usual fabrication process, the patterning of the photodetection unit 14, and the formation of the p type electrode 36 and the n type electrode 38, etc. are performed.

Thus, the semiconductor photodetecting device according to the present embodiment is fabricated.

As described above, according to the present embodiment, the InP clad layer 20b is formed on the upper surface of the InGaAsP core layer 18 near the optical coupling with the mesa-shaped PIN photodiode 32 to form the optical waveguide near the optical coupling with the PIN photodiode 32 in the ridge shape, whereby the mesa-shaped photodetector and the optical waveguide can be monolithically integrated without increasing the optical coupling loss between the mesa-shaped photodetector and the tapered optical waveguide. Thus, the semiconductor photodetecting device which has high photodetecting efficiency and is operative at high speed can be realized.

[A Second Embodiment]

Figure 6:
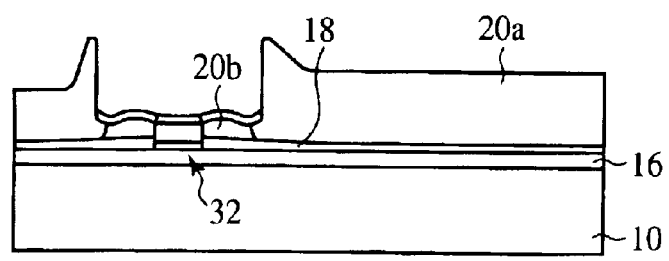
FIG. 6 is a sectional view of the semiconductor photodetecting device according to the first embodiment of the present invention, which has the InP clad layer formed thick.
Figure 7:
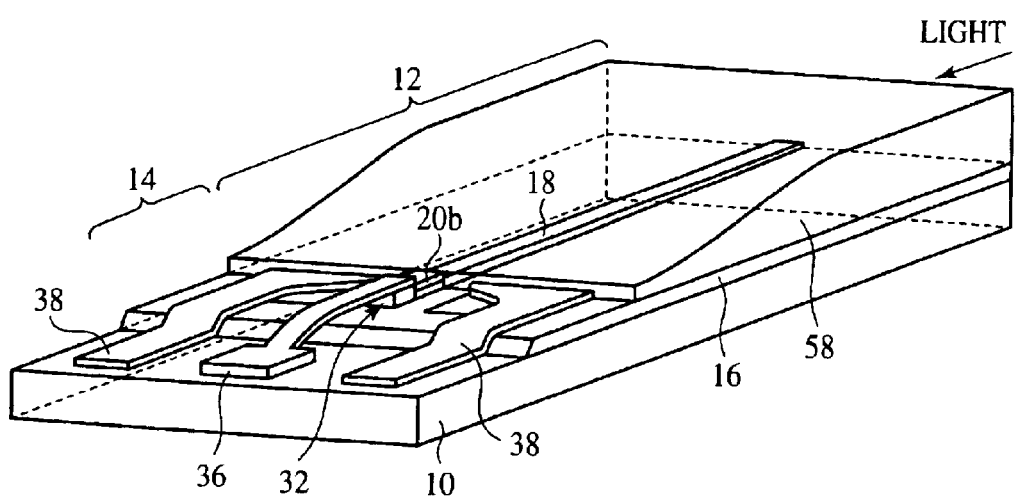
FIG. 7 is a perspective view of the semiconductor photodetecting device according to a second embodiment of the present invention, which shows a structure thereof.
Figure 9A:
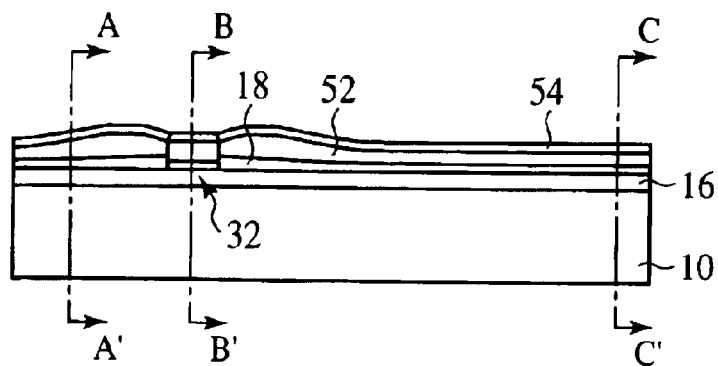
FIGS. 9A–9C is sectional views of the semiconductor photodetecting device according to the second embodiment of the present invention in the steps of the method for fabricating the same, which show the method (Part 1).
Figure 9B:
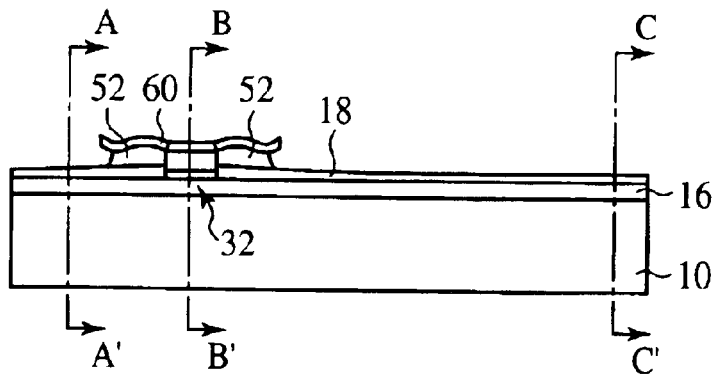
Figure 9C:
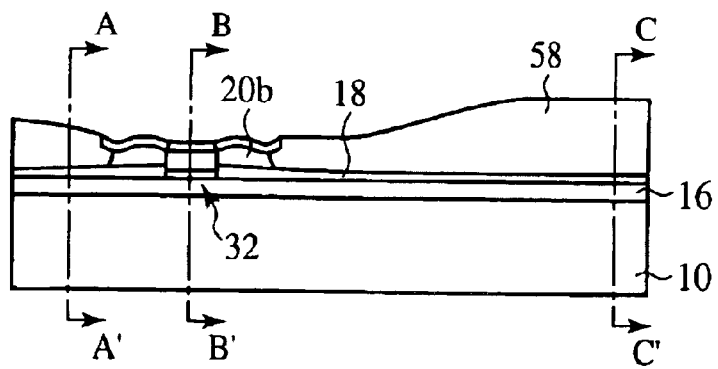
Figure 10A:
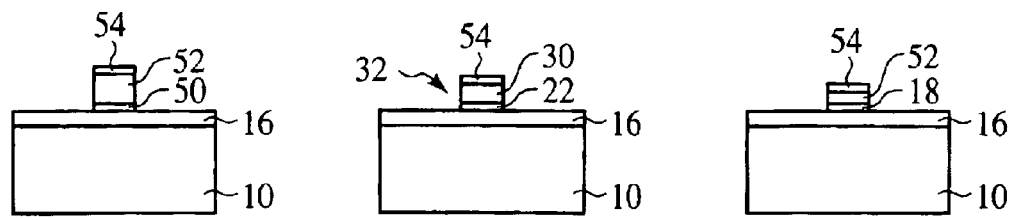
FIGS. 10A–10C are sectional views of the semiconductor photodetecting device according to the second embodiment of the present invention in the steps of the method for fabricating the same, which show the method (Part 2).
Figure 10B:
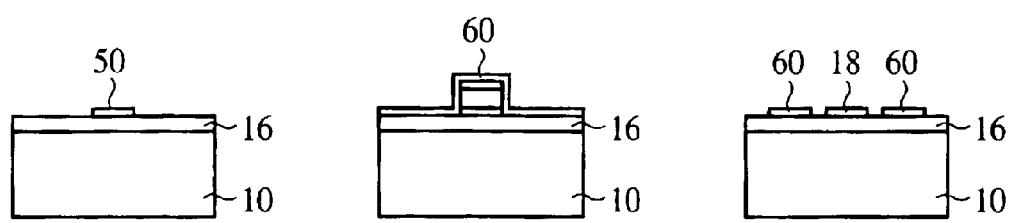
Figure 10C:
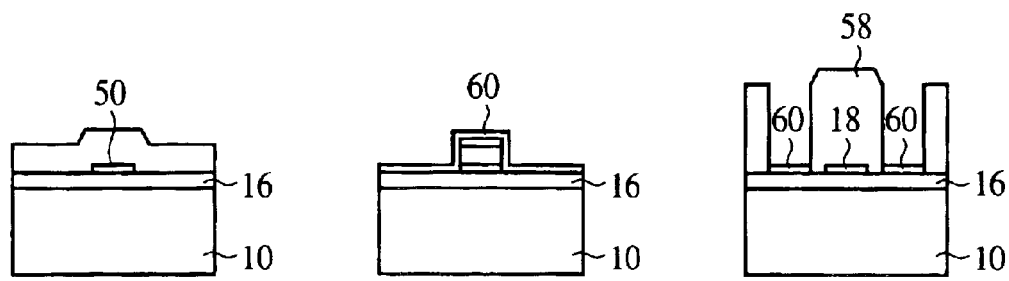
Figure 11:
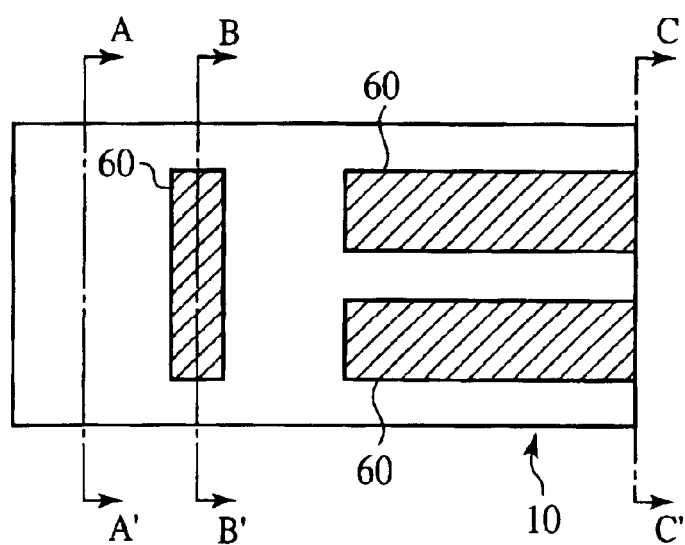
FIG. 11 is an upper side view of a mask used in the method for fabricating the semiconductor photodetecting device according to the second embodiment of the present invention.

The semiconductor photodetecting device according to a second embodiment of the present invention will be explained with reference to FIGS. 6, 7, 8A–8D, 9A–9C, 10A–10C, and 11. FIG. 6 is a sectional view of the semiconductor photodetecting device according to the first embodiment, which has the InP clad layer formed thick. FIG. 7 is a perspective view of the semiconductor photodetecting device according to the present embodiment, which shows a structure thereof. FIGS. 8A–8D are sectional views of the semiconductor photodetecting device according to the present embodiment, which show the structure thereof. FIGS. 9A–9C and 10A–10C are sectional views of the semiconductor photodetecting device according to the present embodiment, which show the method. FIG. 11 is an upper side view of a mask used in the method for fabricating the semiconductor photodetecting device according to the present embodiment. The same members of the present embodiment as those of the semiconductor photodetecting device and the method for fabricating the semiconductor photodetecting device according to the first embodiment are represented by the same reference numbers not to repeat or to simplify their explanation.

In the semiconductor photodetecting device according to the first embodiment described above, it is preferable to make the InP clad layer 20a sufficiently thick near the light incidence end surface so as to facilitate the connection with the outside optical waveguides, such as optical fibers, etc. That is, for low optical coupling loss and high photodetection it is preferable that the thickness of the InP clad layer 20a is, e.g., above 4 μm near the light incidence end surface.

However, the structure of the semiconductor photodetecting device according to the first embodiment has the InP clad layer 20a made thicker with the structure kept as it is will have the following disadvantage. The method for fabricating the semiconductor photodetecting device according to the first embodiment, which forms the InP clad layer 20a thickly will be explained with reference to FIG. 6.

When the InP clad layer 20a has a thickness of, e.g., above 2 μm, it is difficult to smoothly connect the buried optical waveguide portion 12a with the ridge-shaped connection optical waveguide portion 12b. Consequently, when the InP clad layer 20a is formed, the InP clad layer 20a abnormally grows near the connection between the buried optical waveguide portion 12a and the ridge-shaped connection optical waveguide 12b and other parts, and as shown in FIG. 6, irregular concavities and convexities are formed.

The concavities and convexities in the InP clad layer 20a as shown in FIG. 6 make the thickness of the resist film used in the patterning of the photodetection unit 14 which will be performed later disuniform. Resultantly, it will be difficult to pattern the photodetecting unit 14 with high accuracy. Especially, defective electrode patterning of the p type electrode 36, the n type electrode 38, etc. causes contact resistance increase, etc., which can be one factor for low yields.

The irregularity of such abnormal growth of the InP clad layer 20a will make it difficult to remove the InP clad layer 20a by chemical etching or others. Accordingly, the abnormal growth of the InP clad layer 20a itself must be suppressed.

The semiconductor photodetecting device according to the present embodiment and the method for fabricating the same can make the thickness of the clad layer burying the InGaAsP core layer 18 in the buried optical waveguide portion 12a larger near the light incidence end surface while suppressing the above-described abnormal growth. The present embodiment can provide a semiconductor photodetecting device which has high photodetecting efficiency and is operative at high speed, can be easily coupled with external optical waveguides, such as optical fibers, etc. and can be fabricated with high yields.

Figure 8A:
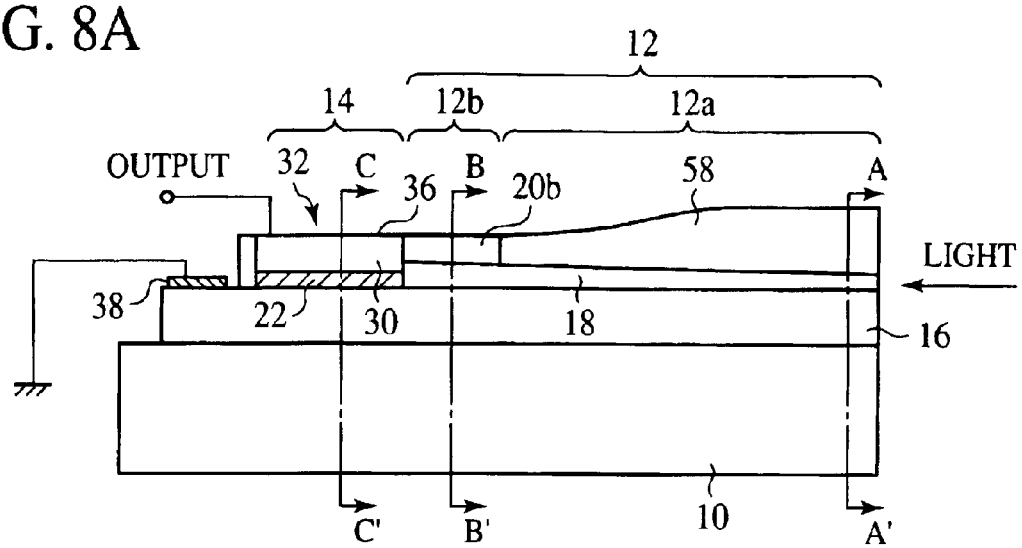
FIGS. 8A–8D are sectional views of the semiconductor photodetecting device according to a second embodiment of the present invention, which shows a structure thereof.
Figure 8B:
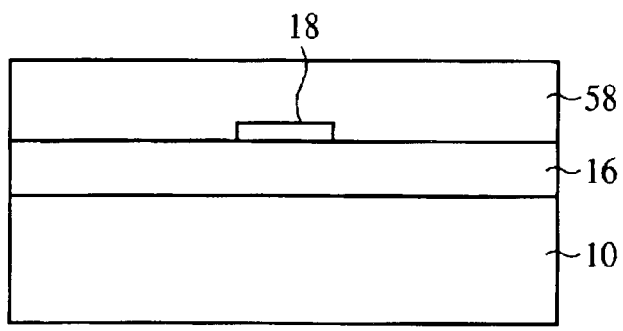
Figure 8C:
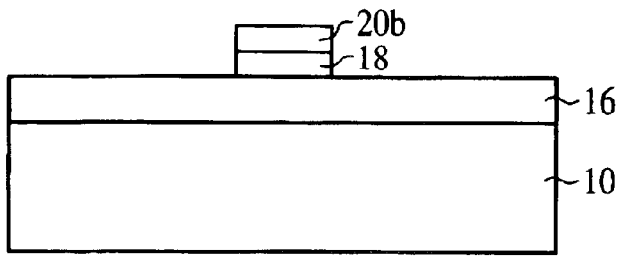
Figure 8D:
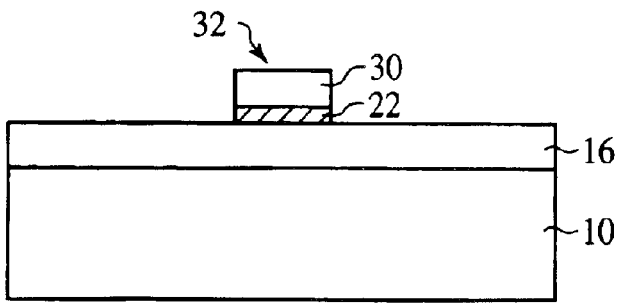

First, the semiconductor photodetecting device according to the present embodiment will be explained with reference to FIGS. 7 and 8A–8D. FIG. 8A is a sectional views of the semiconductor photodetecting device according to the present embodiment in the direction of the propagation of light. FIG. 8B is a sectional view along the line A–A' in FIG. 8A. FIG. 8C is the sectional view along the line B–B' in FIG. 8A. FIG. 8D is the sectional view along the line C–C'.

In the semiconductor photodetecting device according to the present embodiment, an optical waveguide unit 12 and a photodetecting unit 14 are formed on one and the same substrate, as is in the first embodiment. The optical waveguide unit 12 includes a buried optical waveguide portion 12a and a ridge-shaped connection optical waveguide portion 12b.

In the buried optical waveguide portion 12a, a tapered InP clad layer 58 whose thickness is continuously decreased from the light incidence side surface of an SI-InP substrate 10 toward the photodetecting unit 14 on an n type InP layer 16, and an InGaAsP core layer 18 is buried in the InP clad layer 58.

The InP clad layer 58 has a thickness of, e.g., 1.8 μm near a ridge-shaped connection optical waveguide portion 12b and is smoothly connected to an InP clad layer 20b formed on the upper surface of the InGaAsP core layer 18 of the ridge-shaped connection optical waveguide portion 12b.

On the other hand, the InP clad layer 58 has a thickness of, e.g., 4.5 μm near the light incidence end surface. The thickness is sufficient to facilitate the coupling with external optical waveguide, such as optical fibers, etc. with low light losses.

As described above, the semiconductor photodetecting device according to the present embodiment is mainly characterized by the tapered InP clad layer 58 whose thickness is continuously decreased from the end of the SI-InP substrate 10 toward the photodetecting unit 14.

The tapered InP clad layer 58 is formed by the process which will be described later so that the growing speed thereof near the connection with the ridge-shaped connection optical waveguide portion 12b is smaller in comparison with the growing speed thereof near the light incidence end surface. This makes it possible to make the thickness of the InP clad layer 58 near the light incidence end surface sufficiently thick while the abnormal growth thereof near the connection with the ridge-shaped connection optical waveguide portion 12b is suppressed. Thus, the semiconductor photodetecting device according to the present embodiment can be coupled with external optical waveguides, such as optical fibers, etc. at low light losses and easily. The abnormal growth of the InP clad layer 58 is suppressed, whereby the occurrence, etc. of unsatisfactory patterning of the photodetecting unit can be suppressed, which permits the semiconductor photodetecting device according to the present embodiment to be fabricated with high yields.

Next, the method for fabricating the semiconductor photodetecting device according to the present embodiment will be explained with reference to FIGS. 9A–9C, 10A–10C, and 11. FIGS. 9A–9C are sectional views of the semiconductor photodetecting device shown in FIG. 8A in the direction of the propagation of light. Figures on the left side of FIGS. 10A, 10B, and 10C are sectional views along the line A–A' respectively in FIGS. 9A, 9B, and 9C. Figures in the middle of FIGS. 10A, 10B, and 10C are sectional views along the line B–B' respectively in FIGS. 9A, 9B, and 9C. Figures on the right side of FIGS. 10A, 10B, and 10C are sectional views along the line C–C' respectively in FIGS. 9A, 9B, and 9C. FIG. 11 is the upper side view of a mask used in the method for fabricating the semiconductor photodetecting device according to the present embodiment.

The method for fabricating the semiconductor photodetecting device according to the present embodiment is characterized mainly in that the InP clad layer 58 burying the InGaAsP core layer 18 is formed to continuously decrease the thickness from the end of the SI-InP substrate 10 toward the photodetecting unit 14.

In the same way as in the method for fabricating the semiconductor photodetecting device according to the first embodiment shown in FIGS. 3A–3D and 4A–4D, the InGaAsP core layer 18 and the PIN photodiode 32 are formed on the SI-InP substrate 10 (see FIGS. 9A and 10A).

Next, a silicon oxide film is formed on the entire surface by, e.g., CVD. Subsequently, as shown in FIG. 11, the silicon oxide film 60 covering the ridge-shaped regions containing both sides of the PIN photodiode 32, and the ridge-shaped regions sandwiching the region where the InGaAsP core layer 18 is formed by lithography and etching.

Next, with the silicon oxide film 60 as a mask, the InP layer 52 is patterned by, e.g., RIE. Thus, the InP layer 52 formed on the upper surface of the InGaAsP layer 50 near both sides of the PIN photodiode 32 remains (see FIG. 9B and 10B). Thus, the InP clad layer 20 is formed on the InGaAsP core layer 18 in the ridge-shaped connection optical waveguide portion 12b.

Then, with the silicon oxide film 60 as a selective growth mask, the InP layer is formed on the entire surface by, e.g., MOVPE. As conditions for forming the film, for example, the raw material gas can be phosphine or arsine, and the film forming temperature can be 600° C.

The size of the silicon oxide film 60 used as the selective growth mask shown in FIG. 11 is, e.g., can be as follows when the semiconductor photodetecting device 1 chip has dimensions of a 500 μm-width and a 600 μm-length. That is, the length of the ridge-shaped region containing both sides of the PIN photodiode 32, where the silicon oxide film 60 is formed is 30 μm, and a width thereof is 360 μm. The ridge-shaped regions sandwiching the region where the InGaAsP core layer 18 is formed each have a 260 μm-length and a 165 μm-width, and the region between them of a 260 μm-length and a 30 μm-width is exposed.

In forming the InP layer, the raw material atoms deposited on the silicon oxide film 60 move along the surface of the silicon oxide film 60 to deposit in the region where the silicon oxide film 60 is not formed. Thus, the growing speed of the InP layer has a distribution; the growing speed of the InP layer in the region sandwiched by the ridge-shaped silicon oxide film 60, where the InGaAsP core layer 18 is formed is higher near the light incidence end surface than near the connection with the ridge-shaped connection optical waveguide portion 12b. Resultantly, the InP layer is formed thicker at the light incidence end surface than near the connection with the ridge-shaped connection optical waveguide portion 12b.

Thus, the InGaAsP core layer 18 in the buried optical waveguide portion 12a is buried in the tapered InP clad layer 58 whose thickness is continuously decreased from the light incidence end surface of the SI-InP substrate 10 toward the photodetecting unit 14 (see FIGS. 9C and 10C).

Then, the patterning of the photodetecting unit 14, the formation of the p type electrode 36 and the n type electrode 38, etc. are performed by the usual fabrication process.

Thus, the semiconductor photodetection device according to the present embodiment is fabricated.

As described above, the InP clad layer 20b is formed on the upper surface of the InGaAsP core layer 18 near the portion of the optical coupling with the mesa-shaped PIN photodiode 32 to thereby form the optical waveguide in the ridge-shape near the portion of the optical coupling with the PIN photodiode 32, whereby the mesa-shaped photodetector and the tapered optical waveguide can be monolithically integrated without loss increase of the optical coupling between the PIN photodiode 32 and the optical waveguide. Thus, the semiconductor photodetecting device which has high photodetecting efficiency and is operative at high speed can be realized.

Furthermore, the InP clad layer 20a is formed in the buried optical waveguide portion 12a in a thickness which is continuously decreased from the light incidence end surface of the toward the PIN photodiode 32, whereby the abnormal growth of the InP clad layer 20a near the ridge-shaped connection optical waveguide portion 12b can be suppressed.

Thus, the unsatisfactory patterning, etc. of the photodetecting unit 14 can be suppressed, whereby the semiconductor photodetecting device which has high photodetecting efficiency and is operative at high speed can be fabricated with high yields.

In the present embodiment, the ridge-shaped connection optical waveguide portion 12b is formed between the photodetecting unit 14 and the buried optical waveguide portion 12a, but the ridge-shaped connection optical waveguide portion 12b may not be essentially formed.

[A Third Embodiment]

The semiconductor photodetecting device according to a third embodiment of the present invention will be explained with reference to FIGS. 12A–12D. FIGS. 12A–12D are sectional views of the semiconductor photodetecting device according to the present embodiment, which shows the structure thereof. The same members of the present embodiment as those of the semiconductor photodetecting device according to the second embodiment and the method for fabricating the semiconductor device are represented by the same reference numbers not to repeat or to simplify their explanation.

Figure 12A:
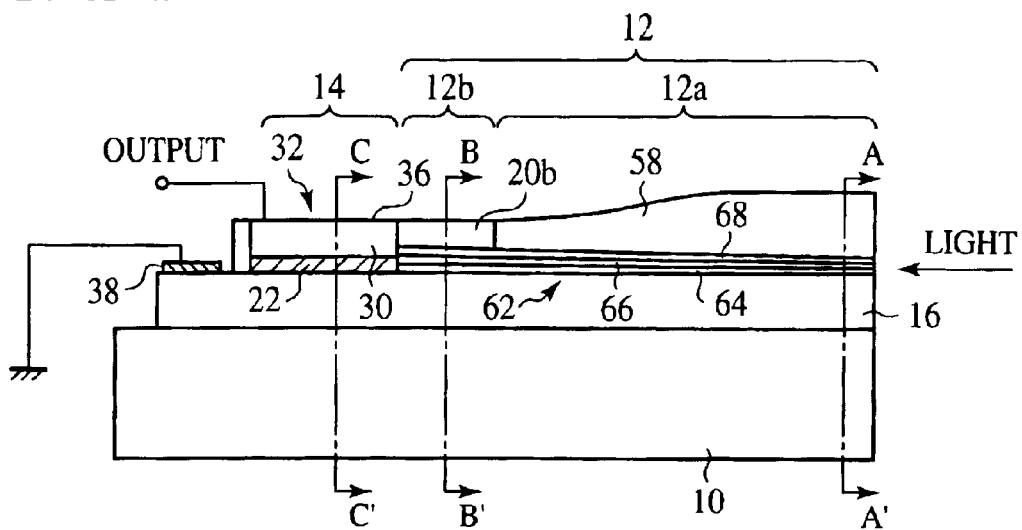
FIGS. 12A–12D are sectional views of the semiconductor photodetecting device according to a third embodiment of the present invention, which show a structure thereof.
Figure 12B:
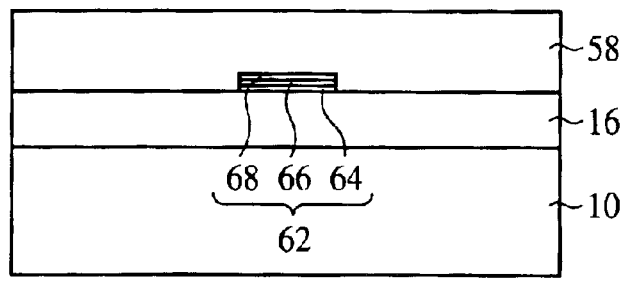
Figure 12C:
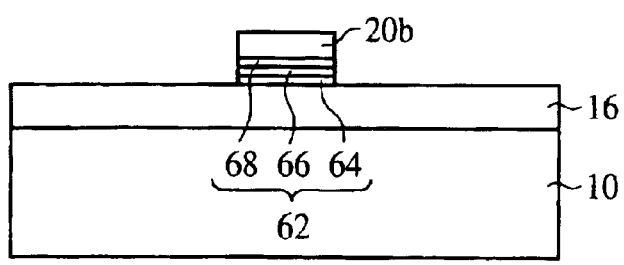
Figure 12D:
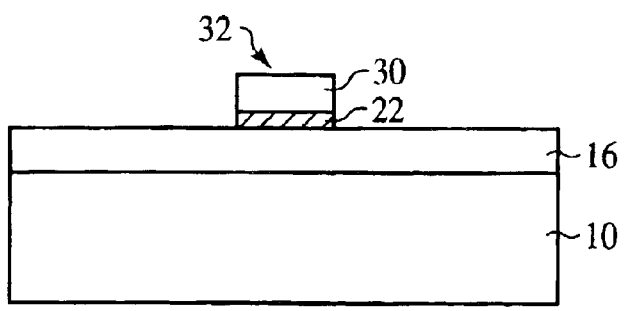

The semiconductor photodetecting device according to the present embodiment corresponds to the semiconductor photodetecting device according to the second embodiment having the tapered core layer formed in a layer structure. The structure of the semiconductor photodetecting device according to the present embodiment will be explained with reference to FIGS. 12A–12D. FIG. 12A is a sectional view of the semiconductor photodetecting device according to the present embodiment in the direction of the propagation of light. FIG. 12B is the sectional view along the line A–A' in FIG. 12A. FIG. 12C is the sectional view along the line B–B' in FIG. 12A. FIG. 12D is the sectional view along the line C–C' in FIG. 12A.

A tapered core layer 62 whose thickness is continuously increased from the end of an SI-InP substrate 10 toward a photodetecting unit 14 is formed on an n type InP layer 16 of an optical waveguide unit 12.

The core layer 62 is formed of an InGaAsP layer 64, an InP layer 66 and an InGaAsP layer 68 sequentially laid on the n type InP layer 16. At the incidence end, for example, the thickness of the InGaAsP layer 64 is 0.039 μm, the thickness of the InP layer 66 is 0.002 μm, and the thickness of the InGaAsP layer 68 is 0.039 μm. Near the photodetecting unit 14, for example, the thickness of the InGaAsP layer 64 is 0.17 µm, the thickness of the InP layer 66 is 0.003 µm, and the thickness of the InGaAsP layer is 0.17 µm.

As described above, the semiconductor photodetecting device according to the present embodiment is characterized mainly by the tapered core layer 62 of the multi-layer structure. The optical waveguide has the multi-layer structure, and a film thickness ratio of the multi-layer films is varied by semiconductor material compositions, whereby a large effective film thickness ratio can be obtained, and optimum mode diameter conversion can be realized. The optical waveguide of the multi-layer structure is described in, e.g., Japanese Patent Application Laid-Open Publication 2002-26370 the inventors of which are some of the inventors of the present application.

The multi-layer tapered core layer 62 can be formed by sequentially forming the InGaAsP layer 64, the InP layer 66 and the InGaAsP layer 68 in the same way as in forming the InGaAsP core layer 18 in the tapered shape in the first and the second embodiments.

In the present embodiment, the core layer 62 is of three-layered structure. However, the core layer 62 is not essentially of three-layered structure, and may have two layers or more than 3 layers of multi-layered structure.

In the present embodiment, the tapered optical waveguide layer of the semiconductor photodetecting device according to the second embodiment has the core layer 62 of the multi-layered structure. The tapered core layer of the semiconductor photodetecting device according to the other embodiments can be the core layer 62 of the multi-layer structure, whereby the same effect as that provided by the present embodiment can be provided.

[A Fourth Embodiment]

The semiconductor photodetecting device according to a fourth embodiment of the present invention will be explained with reference to FIGS. 13A–13D. FIGS. 13A–13D are sectional views of the semiconductor photodetecting device according to the present embodiment, which show a structure thereof. The same members of the present embodiment as those of the semiconductor photodetecting device according to the second embodiment and the method for fabricating the same are represented by the same reference numbers not to repeat or to simplify their explanation.

Figure 13A:
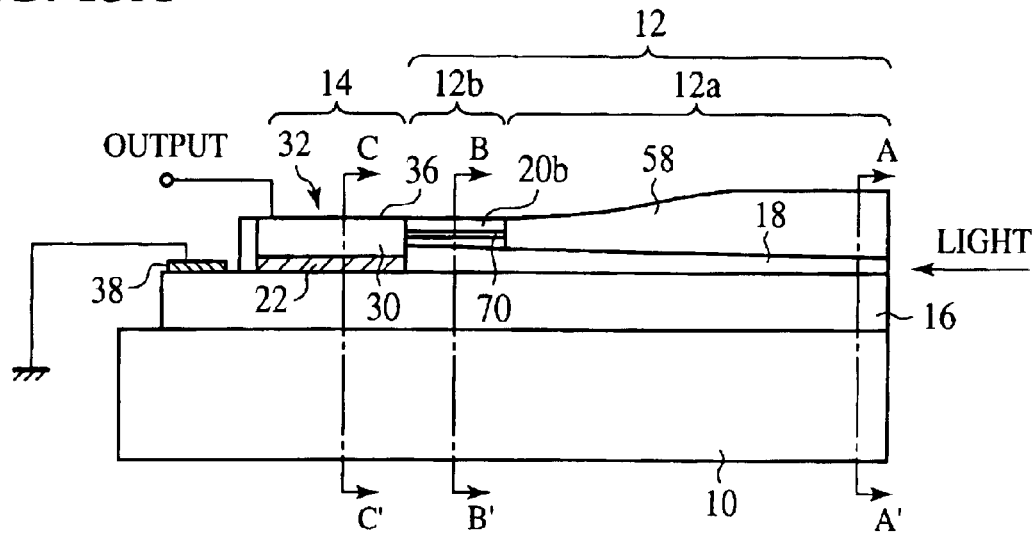
FIGS. 13A–13D are sectional views of the semiconductor photodetecting device according to a fourth embodiment of the present invention, which show a structure thereof.
Figure 13B:
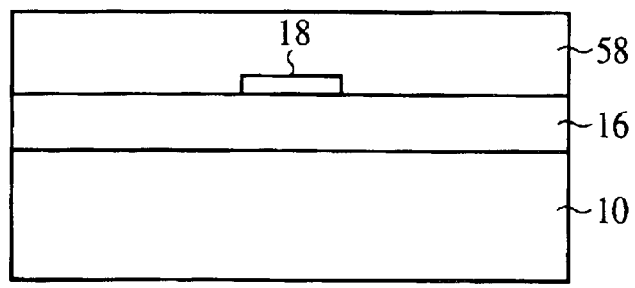
Figure 13C:
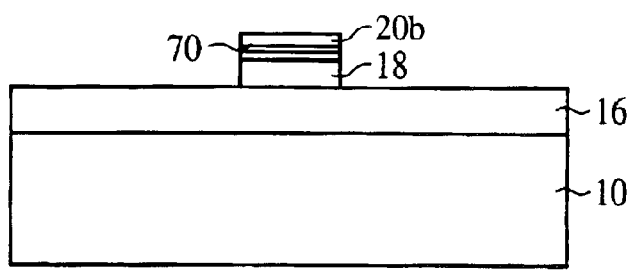
Figure 13D:
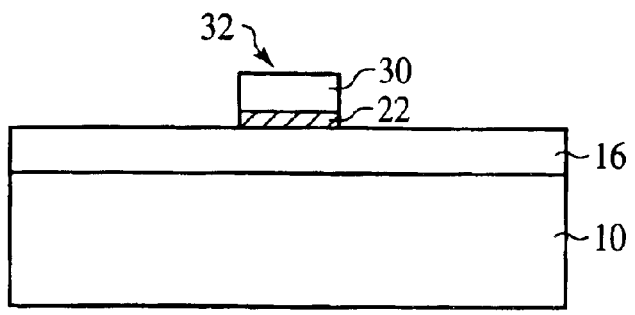

The semiconductor photodetecting device according to the present embodiment corresponds to the semiconductor photodetecting device according to the second embodiment in which a layer number of the buried optical waveguide portion 12a is different from a layer number of the ridge-shaped connection optical waveguide portion 12b. The structure of the semiconductor photodetecting device according to the present embodiment will be explained with reference to FIGS. 13A–13D. FIG. 13A is the sectional view of the semiconductor photodetecting device according to the present embodiment in the direction of the propagation of light of the semiconductor device according to the present embodiment. FIG. 13B is the sectional view along the line A–A' in FIG. 13A. FIG. 13C is the sectional view along the line B–B' in FIG. 13A. FIG. 13D is the sectional view along the line C–C' in FIG. 13A.

As shown in FIGS. 13A and 13C, in a ridge-shaped connection optical waveguide portion 12b, an InGaAsP layer 70 is formed in an InP layer 20b formed on the upper surface of an InGaAsP core layer 18.

As described above, the semiconductor photodetecting device according to the present embodiment is characterized mainly in that a layer number of a buried optical waveguide portion 12a and a layer number of the ridge-shaped connection optical waveguide portion 12b are different from each other.

For better optical coupling between the buried optical waveguide portion 12a and the ridge-shaped connection optical waveguide portion 12b, it is necessary to improve overlap of the longitudinal modes.

The layer number of the buried optical waveguide portion 12a and that of the ridge-shaped connection optical waveguide portion 12b are different from each other by, as described above, making the layer number of the ridge-shaped connection optical waveguide 12b larger, whereby the longitudinal mode of the ridge-shaped connection optical waveguide portion 12b is spread to thereby improve the optical coupling and decrease the light loss.

The present embodiment corresponds to the semiconductor photodetecting device according to the second embodiment in which the layer number of the buried optical waveguide portion 12a and the layer number of the ridge-shaped connection optical waveguide portion 12b are different from each other, but in the semiconductor photodetecting device according to the other embodiments, a layer number of the buried optical waveguide portion 12a and a layer number of the ridge-shaped connection optical waveguide portion 12b may be different from each other, whereby the same effect as that produced by the present embodiment can be produced.

[A Fifth Embodiment]

The semiconductor photodetecting device according to a fifth embodiment of the present invention will be explained with reference to FIGS. 14A–14D. FIGS. 14A–14D are sectional views of the semiconductor photodetecting device according to the present embodiment, which show a structure thereof. The same members of the present embodiment as those of the semiconductor photodetecting device according to the second embodiment and the method for fabricating the same are represented by the same reference numbers not to repeat or to simplify their explanation.

Figure 14A:
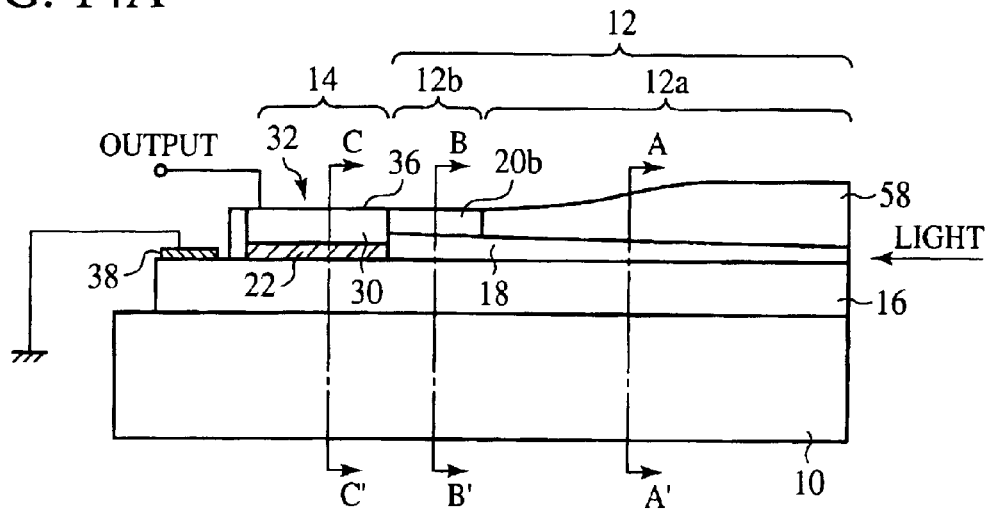
FIGS. 14A–14D are sectional views of the semiconductor photodetecting device according to a fifth embodiment of the present invention, which show a structure thereof.
Figure 14B:
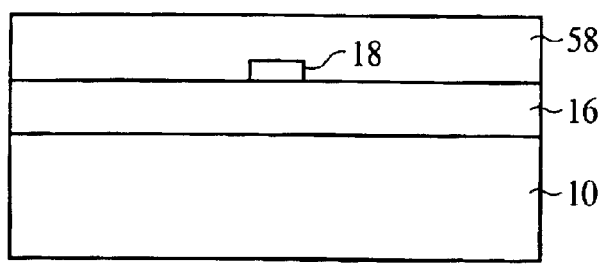
Figure 14C:
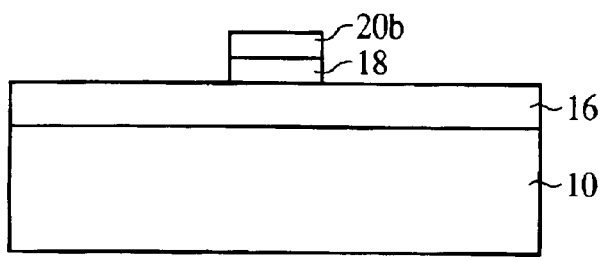
Figure 14D:
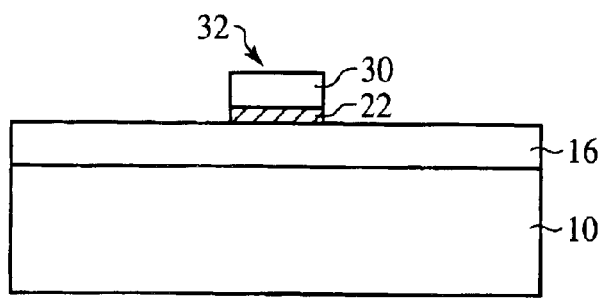

The semiconductor photodetecting device according to the present embodiment corresponds to the semiconductor photodetecting device according to the second embodiment in which a width of the InGaAsP core layer 18 at the buried optical waveguide portion 12a and that at the ridge-shaped connection optical waveguide portion 12b are different from each other. The structure of the semiconductor photodetecting device according to the present embodiment will be explained below with reference to FIGS. 14A–14D. FIG. 14A is the sectional view of the semiconductor photodetecting device according to the present embodiment in the direction of the propagation of light. FIG. 14B is the sectional view along the line A–A' in FIG. 14A. FIG. 14C is the sectional view along the line B–B' in FIG. 14A.

As shown in FIGS. 14B and 14C, the width of the InGaAsP core layer 18 at the buried optical waveguide portion 12a is smaller than that at the ridge-shaped connection optical waveguide portion 12b. For example, the width of the InGaAsP core layer at the buried optical waveguide portion 12a is 6 µm, and that at the ridge-shaped connection optical waveguide portion 12b is 8 µm.

As described above, the semiconductor photodetecting device according to the present embodiment is characterized mainly in that the width of the InGaAsP core layer 18 at the buried optical waveguide portion 12a is smaller than that at the ridge-shaped connection optical waveguide portion 12b. Making the width of the InGaAsP core layer 18 different from that at the ridge-shaped connection optical waveguide portion 12b makes it possible to reduce light loss at the optical coupling between the buried optical waveguide portion 12a and the ridge-shaped connection optical waveguide portion 12b.

The InGaAsP core layer 18 having the width which is different at the buried optical waveguide portion 12a and at the ridge-shaped connection optical waveguide portion 12b can be formed by the method for fabricating the semiconductor photodetecting device according to the second embodiment in which the silicon oxide film 54 used as the mask in striping the InGaAsP layer 50 is patterned to have portions of prescribed different widths.

To make the effect of reducing the light loss sufficient it is preferable to make a width of the InGaAsP core layer 18 at the buried optical waveguide portion 12a smaller by above 0.5 μm than a width of the InGaAsP core layer 18.

In the present embodiment, the width of the InGaAsP core layer 18 at the buried optical waveguide portion 12a of the semiconductor photodetecting device according to the second embodiment is smaller than the width at the ridge-shaped connection optical waveguide portion 12b. The semiconductor photodetecting device according to the other embodiments can provide the same effect by making the width of the InGaAsP core layer 18 at the buried optical waveguide portion 12a smaller than that at the ridge-shaped connection optical waveguide portion 12b.

[A Sixth Embodiment]

The semiconductor photodetecting device according to a sixth embodiment of the present invention will be explained with reference to FIGS. 15A–15D. FIGS. 15A–15D are sectional views of the semiconductor photodetecting device according to the present embodiment, which has a structure thereof. The same members of the present embodiment as those of the semiconductor photodetecting device according to the first embodiment and the method for fabricating the same are represented by the same reference numbers not to repeat or to simplify their explanation.

Figure 15A:
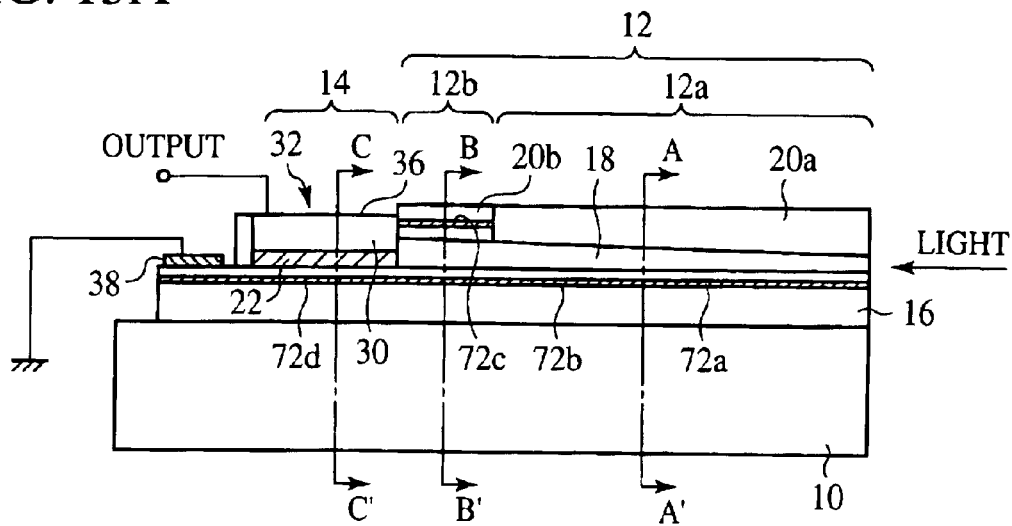
FIGS. 15A–15D are sectional views of the semiconductor photodetecting device according to a sixth embodiment of the present invention, which show a structure thereof.
Figure 15B:
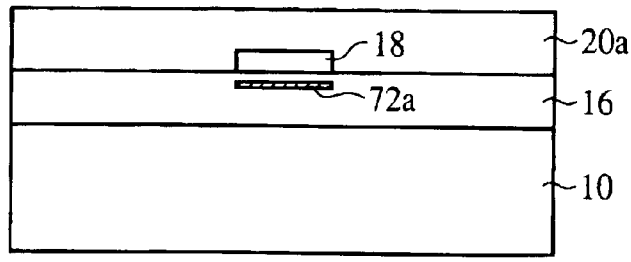
Figure 15C:
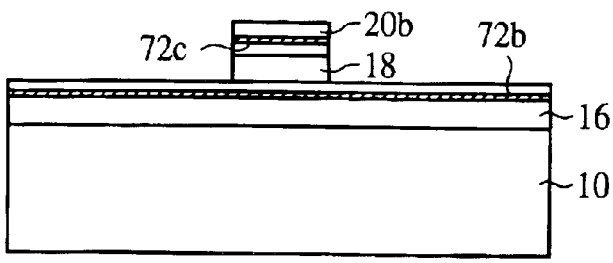
Figure 15D:
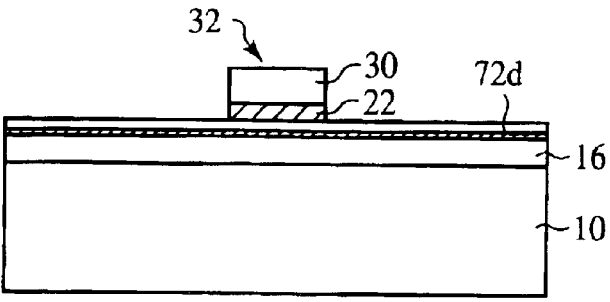

The semiconductor photodetecting device according to the present embodiment corresponds to the semiconductor device according to the first embodiment in which InGaAsP layers are inserted respectively in the n type InP layer 16 and in the InP layer 20b formed on the upper surface of the InGaAsP core layer 18 of the ridge-shaped connection optical waveguide portion 12b. The structure of the semiconductor photodetecting device according to the present embodiment will be explained with reference to FIGS. 15A–15D. FIG. 15A is the sectional view of the semiconductor photodetecting device according to the present embodiment in the direction of the propagation of light. FIG. 15B is the sectional view long the line A–A'. FIG. 15C is the sectional view along the line B–B'. FIG. 15D is the sectional view along the line D–D.

The InGaAsP layer 72a having substantially the same width as an InGaAsP core layer 18 is inserted in an n type InP layer 16 below the InGaAsP core layer 18 of a buried optical waveguide portion 12a.

The InGaAsP layer 72b is inserted also in the n type InP layer 16 of a ridge-shaped connection optical waveguide portion 12b. The InGaAsP layer 72c having substantially the same width as the InGaAsP core layer 18 is inserted also in an InP clad layer 20b formed on the upper surface of the InGaAsP core layer 18 of the ridge-shaped connection optical waveguide portion 12b.

The InGaAsP layer 72d is inserted also in the n type InP layer 16 of a photodetecting unit 14.

The InGaAsP layers 72a, 72b, 72d inserted in the n type InP layer 16 are formed of one and the same InGaAs layer.

As described above, the semiconductor photodetecting device according to the present embodiment is characterized mainly in that the InGaAsP layer 72c whose etching characteristics are different from those of the InP clad layer 20b is inserted in the InP clad layer 20bof the ridge-shaped connection optical waveguide portion 12b.

In this case, the InP clad layer 20b is formed by inserting the InGaAsP layer 72c when the InP layer 52 is formed and patterning the InGaAsP layer 72c and the InP layer 52. Conditions for the etching are suitably set not to side-etch the InP layer 52 but to side-etch the InGaAsP layer 72c when the InP layer 52 and the InGaAsP layer 72c are etched with the silicon oxide film 56 as a mask, so that the InP layer 52 and the InGaAsP layer 72c can be etched. Thus, concavities and convexities are formed in the side surface of the InP clad layer 20b. The concavities and convexities permit the InP clad layer 20b and the InP clad layer 20a to be smoothly jointed each other when the InP layer is regrown to form the InP clad layer 20a of the buried optical waveguide portion 12a. Thus, the connection between the buried optical waveguide portion 12a and the ridge-shaped connection optical waveguide portion 12b, which has a step can be jointed smooth.

The above-described InGaAsP layers 72a, 72b, 72c, 72d can be inserted by the method for fabricating the semiconductor photodetecting device according to the first embodiment in which the steps of forming the InGaAsP layers are added respectively between the steps of forming the layers into which the InGaAsP layers are to be inserted.

In the present embodiment, the InGaAsP layers are inserted in the prescribed layers of the semiconductor photodetecting device according to the first embodiment, but in the semiconductor photodetecting device according to the other embodiments, the InGaAsP layers are inserted, as in the present embodiment, whereby the same effect can be produced.

In the present embodiment, the InGaAsP layer is inserted, but another four-atom layer of InAlAsP or others whose etching characteristics are different from those of the InP clad layer for the four-atom layer to be inserted in may be inserted in.

[A Seventh Embodiment]

Figure 16A:
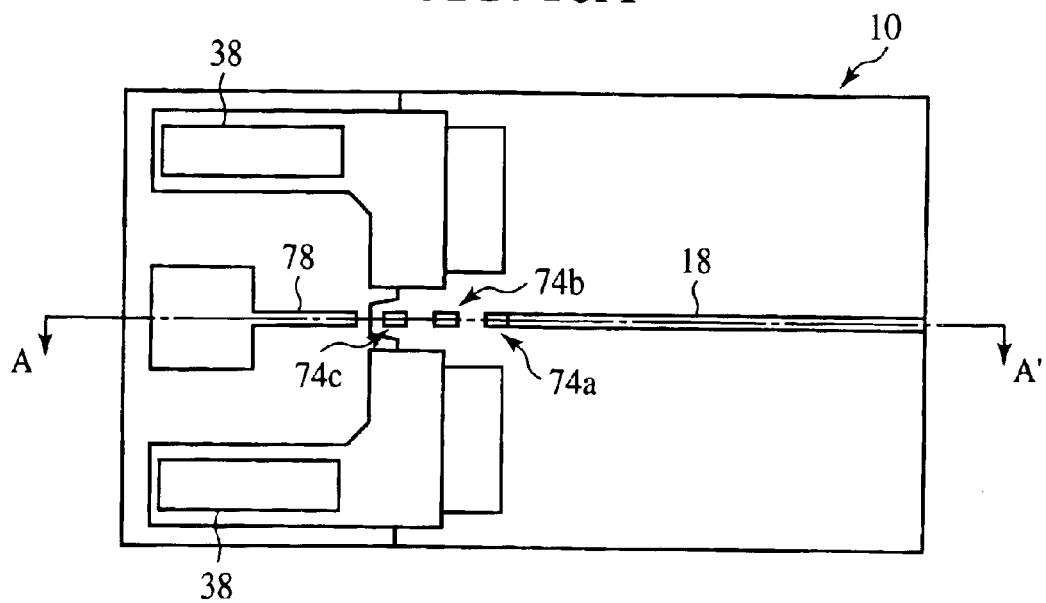
FIGS. 16A–16C are diagrammatic views of the semiconductor photodetecting device according to a seventh embodiment of the invention, which show a structure thereof.
Figure 16B:
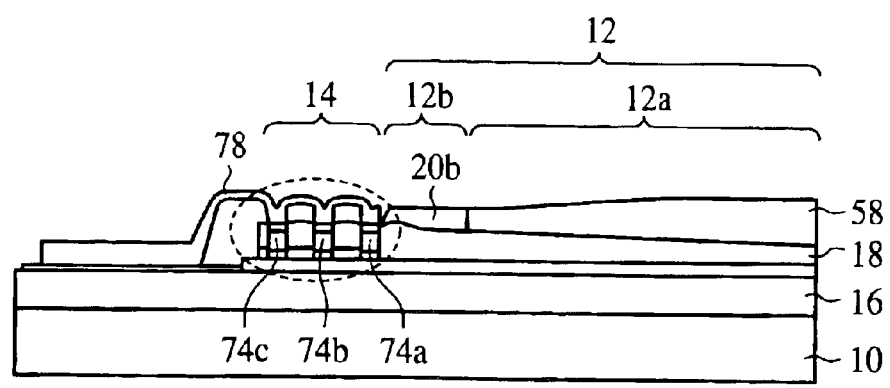
Figure 16C:
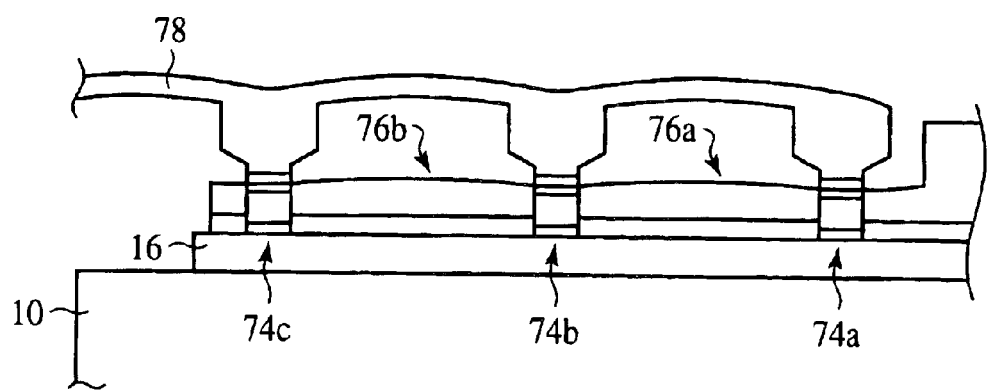

The semiconductor photodetecting device according to a seventh embodiment of the present invention will be explained with reference to FIGS. 16A–16C. FIGS. 16A–16C are sectional views of the semiconductor photodetecting device according to the present embodiment, which shows a structure thereof.

The semiconductor photodetecting device according to the present embodiment corresponds to the semiconductor photodetecting device according to the second embodiment in which a plurality of the PIN photodiodes are arranged serially in the direction of the propagation of light. The structure of the semiconductor photodetecting device according to the present embodiment will be explained with reference to FIGS. 16A–16C. FIG. 16A is the upper side view of the semiconductor photodetecting device according to the present embodiment, which shows the structure thereof. FIG. 16B is the sectional view along the line A–A' in FIG. 16A. FIG. 16C is an enlarged view of the part surrounded by the ellipse drawn by the dot line in FIG. 16B.

In a photodetecting unit 14, the PIN photodiodes 74a, 74b, 74c are serially arranged in the direction of the propagation of light. Each PIN photodiode 74a, 74b, 74c is of the mesa-shape of an n type InP layer 16, a non-doped InGaAs light absorption layer 22 and a p type semiconductor layer 30 laid one on another, as are the PIN photodiode 32 of the above-described embodiments.

An InGaAsP core layer 18 is directly connected to one side surface of the PIN photodiode 74a for the optical coupling, as is in the second embodiment.

The opposed end surfaces of the PIN photodiode 74a and the PIN photodiode 74b are optically coupled by a ridge-shaped connection optical waveguide 76a disposed therebetween. The opposed end surfaces of the PIN photodiode 74b and the PIN photodiode 74c are optically coupled by a mesa-shaped optical waveguide 76b disposed therebetween.

A signal wire 78 is connected by air bridge to the respective upper surfaces of the PIN photodiodes 74a, 74b, 74c.

The semiconductor photodetecting device according to the present embodiment is characterized mainly in that a plurality of the PIN photodiodes are arranged serially in the direction of the propagation of light. The PIN photodiodes 74a, 74b, 74c are arranged serially in the direction of the propagation of light in the photodetecting unit 14, whereby the device capacitance of the photodetecting unit 14 can be smaller in comparison with that of the photodetecting unit using one PIN photodiode 32.

Light which has propagated through the InGaAsP core layer 18 is incident on the respective PIN photodiodes 74a, 74b, 74c which are optically coupled with one another by the optical waveguides 76a, 76b. The respective PIN photodiodes 74a, 74b, 74c output electric signals corresponding to intensities of the incident light to the signal wire 78.

The above-described PIN photodiodes 74a, 74b, 74ccan be formed by the method for fabricating the semiconductor photodetecting device according to the second embodiment in which the silicon oxide film 48 used as the mask for etching the p type InP layer 46, the p type InGaAs layer 44, the p type InP layer 42 and the InGaAs layer 40 is patterned to cover the region for the serially arranged PIN photodiodes 74a, 74b, 74c to be formed in.

Figure 17A:
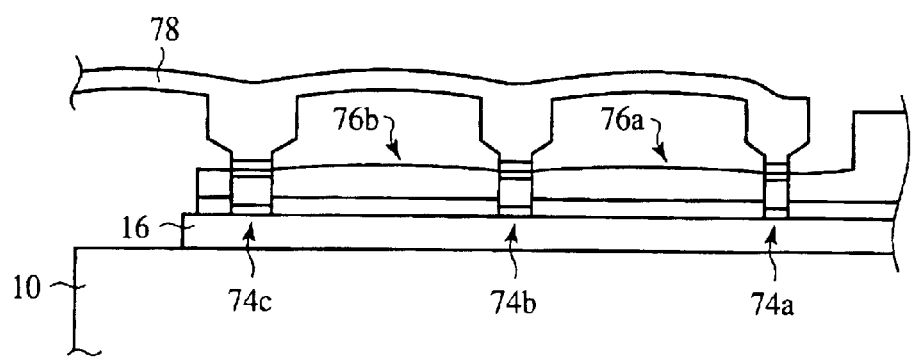
FIGS. 17A and 17B are sectional views of the semiconductor photodetecting device according to a seventh embodiment of the present invention, which show a structure thereof.
Figure 17B:
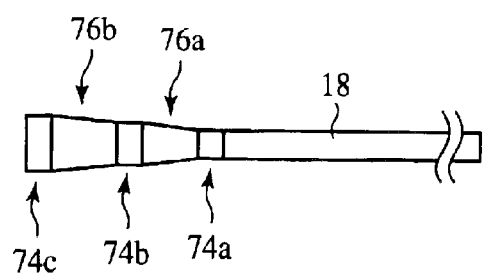

To make the photodetecting sensitivity difference small among the PIN photodiodes 74a, 74b, 74c, which are arranged serially in the direction of the propagation of light, the PIN photodiodes 74a, 74b, 74c may have structures shown in FIGS. 17A and 17B. FIG. 17A is the sectional view of the semiconductor photodetecting device according to Modification 1 of the present embodiment, which corresponds to the sectional view of FIG. 16C. FIG. 17B is the upper side view of the PIN photodiodes of the semiconductor photodetecting device according to Modification 2 of the present embodiment.

For example, as shown in FIG. 17A, device lengths of the PIN photodiodes 74a, 74b, 74c may be gradually larger as the PIN photodiodes 74a, 74b, 74c are located farther from the optical waveguide unit 12, whereby the photodetecting sensitivity difference among the PIN photodiodes 74a, 74b, 74c cam be made small.

As shown in FIG. 17B, widths of the PIN photodiodes 74a, 74b, 74c may be made gradually larger as the PIN photodiodes are located farther from the optical waveguide unit 12. For example, when the InGaAsP core layer 18 has a 3 μm, the PIN photodiodes 74a, 74b, 74c respectively have an about 3 μm width, an about 5 μm width and an about 10 μm width. Widths of the ridge-shaped optical waveguides 76a, 76b as well are made gradually larger so that the PIN photodiodes of different widths can be optically coupled with one another. Thus, the widths of the PIN photodiodes 74a, 74b, 74c are gradually increased, whereby the photodetecting sensitivity difference among the PIN photodiodes 74a, 74b, 74c can be made small.

In the present embodiment, three PIN photodiodes are arranged serially in the direction of the propagation of light, but a number of the arranged PIN photodiodes is not essentially three.

In the present embodiment, a plurality of the PIN photodiodes 74a, 74b, 74c are disposed in the photodetection unit 14 of the semiconductor photodetecting device according to the second embodiment, but similarly a plurality of the PIN photodiodes 74a, 74b, 74c may be disposed in the semiconductor photodetecting device according to the other embodiments, whereby the same effect can be produced.

[Modifications]

The present invention is not limited to the above-described embodiments and can cover other various modifications.

For example, materials forming the semiconductor photodetecting device according to the present invention are not limited to the material groups described in the above embodiments, and suitable material groups can be suitably selected based on wavelengths, etc. of light to be detected. The thicknesses, widths, etc. of the respective layers can be suitably changed as required.

In the above-described embodiments, the silicon oxide films 48, 56 are used as the etching mask and the selective growth mask, films to be used as the etching mask and the selective growth mask are not limited to silicon oxide film.

Figure 18:
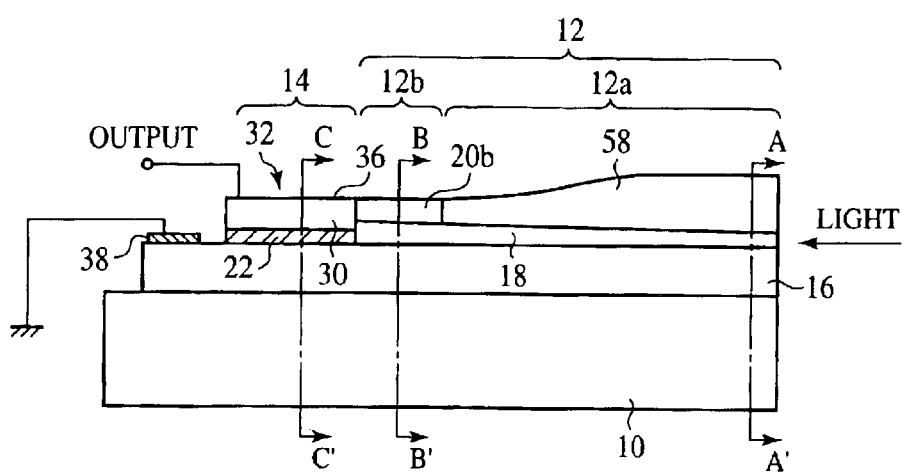
FIG. 18 is a sectional view of the semiconductor photodetecting device according to a modification of the present invention, which shows a structure thereof.
Figure 19A:
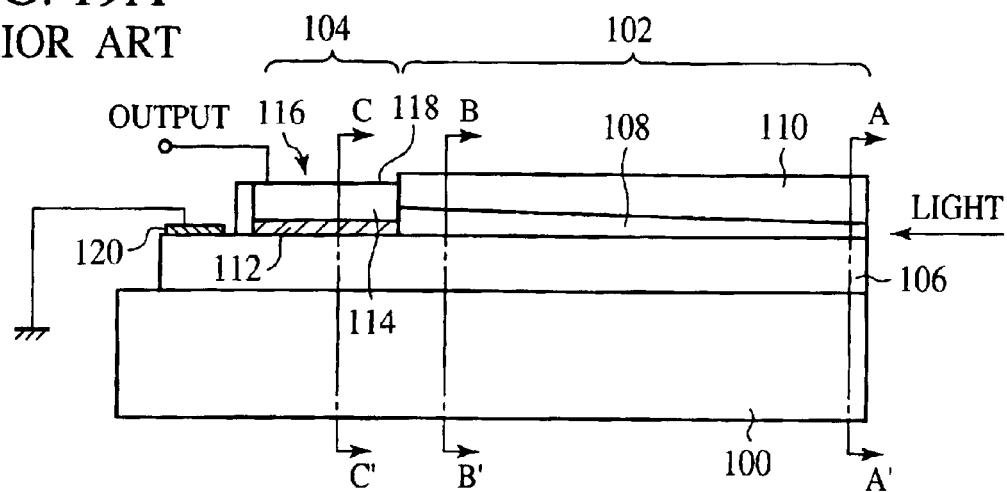
FIGS. 19A–19D are sectional views of the prior art semiconductor photodetecting device, which show the structure thereof.
Figure 19B:
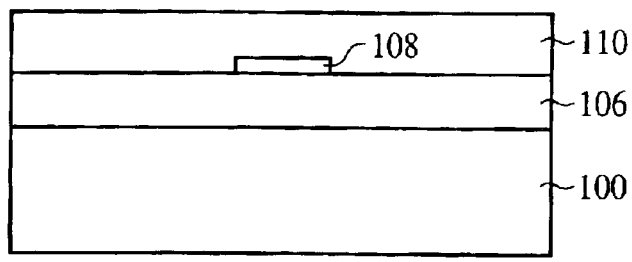
Figure 19C:
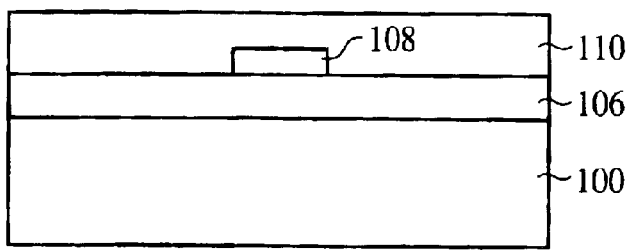
Figure 19D:
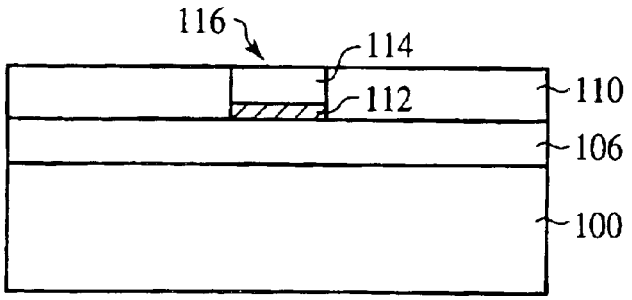

The above-described embodiments, as exemplified in FIG. 8A, have the structure that the joint surface of the photodetection unit 14, which is the sectional surface thereof, is not exposed but may have structures that the joint surface is exposed. FIG. 18 is a sectional view exemplifying the semiconductor photodetecting device according to the present invention, having the structure that the joint surface of the photodetection unit 14, which is the sectional surface thereof, is exposed.

What is claimed is:

1. A semiconductor photodetecting device comprising:
    a photodetector formed on a semiconductor substrate; and
    a tapered optical waveguide formed on the semiconductor substrate and including a tapered core layer which has a film thickness continuously increased toward the photodetector, and an upper clad layer over the tapered core layer having a film thickness continuously decreasing toward the photodetector and having a surface height continuously decreasing toward the photodetector over the entire range from near the photodetector to near the light incidence end surface of the tapered optical waveguide, the side surface of the tapered core layer being covered with the upper clad layer.

2. A semiconductor photodetecting device according to claim 1, wherein
    the photodetector is directly connected to the core layer of the tapered optical waveguide.

3. A semiconductor photodetecting device according to claim 1, wherein
    the core layer of the tapered optical waveguide has a multi-layer structure.

4. A semiconductor photodetecting device according to claim 1, comprising
    a plurality of the photodetectors optically coupled with each other by an optical waveguide.

5. A semiconductor photodetecting device according to claim 4, wherein a length of a light absorption layer of each of said plurality of photodetectors increases as the photodetectors are located farther away from the tapered optical waveguide.

6. A semiconductor photodetecting device according to claim 4, wherein widths of said plurality of photodetectors and a width of the optical waveguide gradually increase as they are located farther away from the tapered optical waveguide.

7. A semiconductor photodetecting device comprising:

a photodetector formed on a semiconductor substrate;

a tapered optical waveguide formed on the semiconductor substrate and including a tapered core layer which has a film thickness continuously increased toward the photodetector, and an upper clad layer which covers the upper and the side surface of the core layer; and a ridge-shaped optical waveguide formed on the semiconductor substrate between the photodetector and the tapered optical waveguide and including a core layer and an upper clad layer selectively covering only the upper surface of the core layer.

8. A semiconductor photodetecting device according to claim 7, wherein a width of the core layer of the ridge-shaped optical waveguide is larger than a width of the core layer of the tapered optical waveguide.

9. A semiconductor photodetecting device according to claim 7, wherein a number of layers forming the tapered optical waveguide is different from a number of layers forming the ridge-shaped optical waveguide.

10. A semiconductor photodetecting device according to claim 7, further comprising:

a layer which is inserted in the upper clad layer of the ridge-shaped optical waveguide and having etching characteristics different from those of the upper clad layer of the ridge-shaped optical waveguide.

11. A semiconductor photodetecting device according to claim 7, wherein the photodetector is directly connected to the core layer of the ridge-shaped optical waveguide.

12. A semiconductor photodetecting device according to claim 7, wherein the core layer of the tapered optical waveguide and/or the core layer of the ridge-shaped optical waveguide has a multi-layer structure.

13. A semiconductor photodetecting device comprising:

a photodetector formed on a semiconductor substrate;

a tapered optical waveguide formed on the semiconductor substrate and including a tapered core layer which has a film thickness continuously increased toward the photodetector and an upper clad layer over the tapered core layer having a film thickness continuously decreasing toward the photodetector and having a surface height continuously decreasing toward the photodetector over the entire range from near the photodetector to near the light incidence end surface of the tapered optical waveguide, the side surface of the tapered core layer being covered with the upper clad layer; and a ridge-shaped optical waveguide formed on the semiconductor substrate between the photodetector and the tapered optical waveguide, and including a core layer and an upper clad layer selectively covering only the upper surface of the core layer.

14. A semiconductor photodetecting device according to claim 13, wherein the photodetector is directly connected to the core layer of the ridge-shaped optical waveguide.

15. A semiconductor photodetecting device according to claim 13, wherein the core layer of the tapered optical waveguide and/or the core layer of the ridge-shaped optical waveguide has a multi-layer structure.

* * * * *